US011973025B2

(12) United States Patent
Lee et al.

(10) Patent No.: US 11,973,025 B2
(45) Date of Patent: Apr. 30, 2024

(54) THREE-DIMENSIONAL SEMICONDUCTOR MEMORY DEVICES

(71) Applicant: Samsung Electronics Co., Ltd., Suwon-si (KR)

(72) Inventors: Seungmin Lee, Seoul (KR); Junhyoung Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 355 days.

(21) Appl. No.: 17/209,871

(22) Filed: Mar. 23, 2021

(65) Prior Publication Data

US 2022/0005759 A1 Jan. 6, 2022

(30) Foreign Application Priority Data

Jul. 1, 2020 (KR) ........................ 10-2020-0081065

(51) Int. Cl.

*H01L 23/522* (2006.01)
*H10B 41/10* (2023.01)
(Continued)

(52) U.S. Cl.

CPC ......... *H01L 23/5226* (2013.01); *H10B 41/10* (2023.02); *H10B 41/27* (2023.02);
(Continued)

(58) Field of Classification Search

CPC ...... G11C 11/5621–5642; G11C 16/02; G11C 16/0466–0475; G11C 16/0408–0458; G11C 16/0483; G11C 2216/06–10; G11C 2216/12–30; G11C 27/005; H10B 20/00–10; H10B 20/27–50; H10B 41/00–70; H10B 41/10; H10B 41/20; H10B 41/27; H10B 41/40; H10B 43/00–50; H10B 43/10; H10B 43/27; H10B 43/35; H10B 43/40; H10B 53/20; H10B 69/00; H01L 23/5226; H01L 27/1024; H01L 27/2463; H01L 27/2481;
(Continued)

(56) References Cited

U.S. PATENT DOCUMENTS 7,547,584 B2 6/2009 Chen et al.
7,605,085 B2 10/2009 Tomita et al.
(Continued)

FOREIGN PATENT DOCUMENTS

CN 108831886 A * 11/2018 ........ H01L 27/11529

OTHER PUBLICATIONS

Translation of CN 108831886 A.*

*Primary Examiner* — David Vu
(74) *Attorney, Agent, or Firm* — HARNESS, DICKEY & PIERCE, P.L.C.

(57) ABSTRACT

A three-dimensional semiconductor memory device includes: a peripheral circuit structure; and a cell array structure on the peripheral circuit structure. The peripheral circuit structure includes a lower wiring on a substrate, a stopping insulating layer on the lower wiring, a contact via on the lower wiring, a floating via on the stopping insulating layer, and an upper wiring on the contact via. The floating via does not contact the lower wiring. The contact via contacts the lower wiring through a via hole in the stopping insulating layer. The upper wiring contacts the contact via.

20 Claims, 19 Drawing Sheets

(51) Int. Cl.

| | |
|---|---|
| ***H10B 41/27*** | (2023.01) |
| ***H10B 41/40*** | (2023.01) |
| ***H10B 43/10*** | (2023.01) |
| ***H10B 43/27*** | (2023.01) |
| ***H10B 43/40*** | (2023.01) |

(52) U.S. Cl.
CPC ............. *H10B 41/40* (2023.02); *H10B 43/10* (2023.02); *H10B 43/27* (2023.02); *H10B 43/40* (2023.02)

(58) Field of Classification Search
CPC ........................... H01L 29/4234–42352; H01L 29/42324–42336; H01L 29/788–7889; H01L 29/792–7926; H01L 2924/145; H01L 2924/1451; H01L 2924/1453; H01L 2924/14511
See application file for complete search history.

(56) References Cited

U.S. PATENT DOCUMENTS

| | | | | |
|---|---|---|---|---|
| 9,431,415 | B2 | 8/2016 | Shin et al. | |
| 9,666,289 | B2 | 5/2017 | Lee et al. | |
| 9,728,549 | B2 | 8/2017 | Yun et al. | |
| 10,446,570 | B2 | 10/2019 | Lee et al. | |
| 2016/0163635 | A1* | 6/2016 | Yun ..................... | H01L 23/3192 257/659 |
| 2020/0105780 | A1* | 4/2020 | Lai ......................... | H10B 43/40 |

* cited by examiner

100
BLn
BL2
BL1
BL0
US
ST1
Mn
Mn−1
Mn−2
M0
ST2
SSL
WLn
WLn−1
WLn−2
S
WL0
GSL
CSL
2
ROW DECODER 100
183b
157
180
322
189
184
320
183a
173i
173
133
146c
P
A1
A2
B
I
I'
II
II'
III
III'
X
Y
Z

THREE-DIMENSIONAL SEMICONDUCTOR MEMORY DEVICES

CROSS-REFERENCE TO RELATED APPLICATION

This application is based on and claims priority under 35 U.S.C. § 119 to Korean Patent Application No. 10-2020-0081065, filed on Jul. 1, 2020, in the Korean Intellectual Property Office, the disclosure of which is incorporated by reference herein in its entirety.

BACKGROUND

The technical idea of the inventive concepts relates to a three-dimensional semiconductor memory device, and more particularly, to a three-dimensional (3D) semiconductor memory device with improved contact reliability between upper and lower wiring layers.

To meet excellent performance and a low price required by consumers, it is required to increase a degree of integration of semiconductor memory devices. In the case of a two-dimensional (2D) or planar semiconductor memory device, because it is difficult to reduce an area occupied by a unit memory cell, it is difficult to improve the degree of integration. Accordingly, 3D semiconductor memory devices having memory cells arranged three-dimensionally have been proposed. A 3D semiconductor memory device is required to improve the reliability of the contact between the upper and lower wiring layers.

SUMMARY

The inventive concepts provides a three-dimensional (3D) semiconductor memory device having improved reliability and degree of integration.

A 3D semiconductor memory device according to some example embodiments of the inventive concepts may include: a peripheral circuit structure; and a cell array structure on the peripheral circuit structure. The peripheral circuit structure may include a lower wiring on a substrate, a stopping insulating layer on the lower wiring, a contact via on the lower wiring, a floating via on the stopping insulating layer, and an upper wiring on the contact via. The contact via may contact the lower wiring through a via hole in the stopping insulating layer. The floating via may not contact the lower wiring. The upper wiring may contact the contact via.

A 3D semiconductor memory device according to some example embodiments of the inventive concepts may include: a peripheral circuit structure, and a cell array structure on the peripheral circuit structure. The peripheral circuit structure may include a first lower wiring on a substrate, a second lower wiring on the substrate, a stopping insulating layer on both the first lower wiring and the second lower wiring, a first floating via on the stopping insulating layer and at least partially overlapping the first lower wiring in a vertical direction that is perpendicular to the horizontal direction, a contact via on the second lower wiring, and an upper wiring on the contact via. The second lower wiring may be isolated from direct contact with the first lower wiring in a horizontal direction. The second lower wiring may be adjacent to the first lower wiring on the substrate in a horizontal direction. The stopping insulating layer may expose the second lower wiring. The first floating via may not contact the first lower wiring. The contact via may contact the second lower wiring through a via hole in the stopping insulating layer. The upper wiring may contact the contact via.

A 3D semiconductor memory device according to some example embodiments of the inventive concepts may include: a peripheral circuit structure, and a cell array structure on the peripheral circuit structure. The peripheral circuit structure may include: a first wiring level including a first lower wiring and a second lower wiring that are each on a substrate, a first insulating layer in the first wiring level and insulating the first lower wiring from the second lower wiring, a stopping insulating layer on the first lower wiring, the second lower wiring, and the first insulating layer, a first floating via on the stopping insulating layer, a contact via on the second lower wiring, a via insulating layer insulating the contact via from the first floating via, a second wiring level on the contact via, and a second insulating layer surrounding the upper wiring in the second wiring level. The second lower wiring may be isolated from direct contact with, and adjacent to, the first lower wiring in a horizontal direction. The stopping insulating layer may expose the second lower wiring. The first floating via may at least partially overlap the first lower wiring in a vertical direction that is perpendicular to the horizontal direction. The contact via may at least partially overlap the second lower wiring in the vertical direction. The first floating via may not contact the first lower wiring. The contact via may contact the second lower wiring through a via hole in the stopping insulating layer. The second wiring level may include an upper wiring contacting the contact via.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
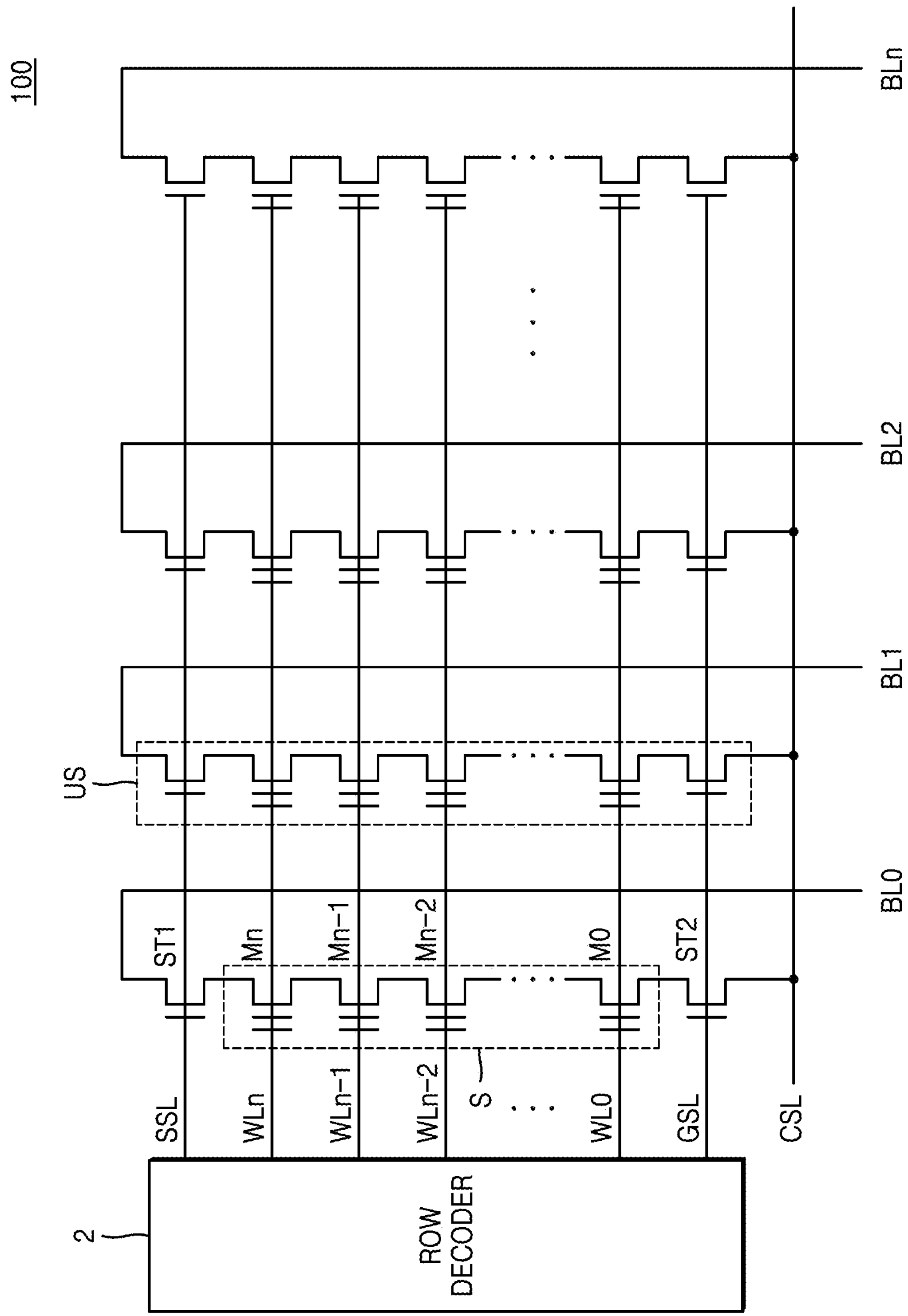
FIGS. 1 and 2 are each a circuit diagram of a three-dimensional (3D) semiconductor device according to some example embodiments of the inventive concepts.

Hereinafter, some example embodiments of the inventive concepts are described in detail with reference to the accompanying drawings. Identical reference numerals are used for the same constituent elements in the drawings, and duplicate descriptions thereof are omitted.

A three-dimensional (3D) semiconductor device of the inventive concepts may have a characteristic that stored data is continuously maintained even when power is not supplied. In addition, an example of a 3D semiconductor device of the inventive concepts is described by using a NAND flash memory device. Accordingly, the descriptions of the inventive concepts may be directly applied to the NAND flash memory device. The 3D semiconductor memory device of the inventive concepts may be referred to as a vertical non-volatile memory device.

Figure 2:
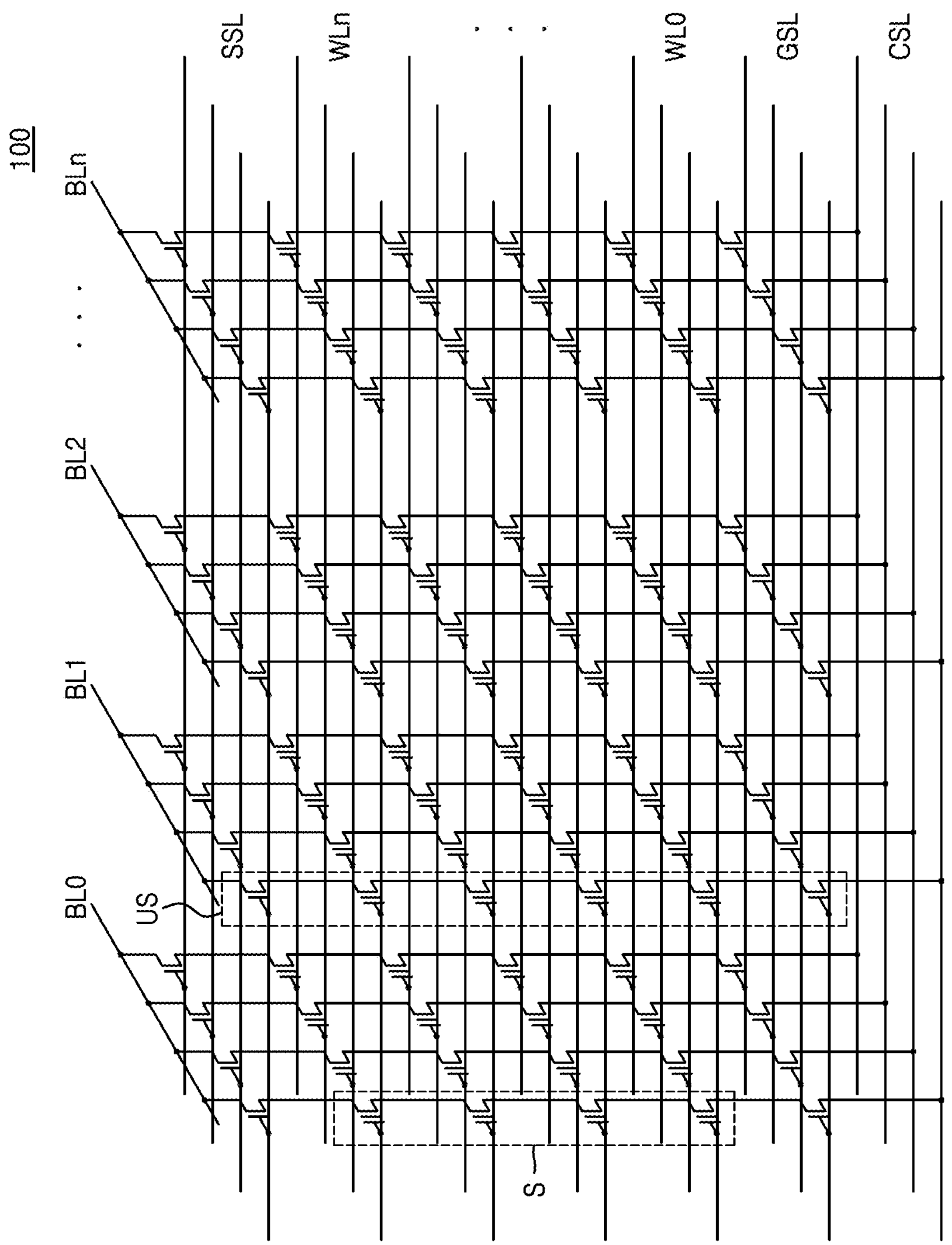

FIGS. 1 and 2 are each a circuit diagram of a 3D semiconductor memory device 100 according to some example embodiments of the inventive concepts.

FIGS. 1 and 2 may be a two-dimensional circuit diagram and a 3D circuit diagram of the 3D semiconductor memory device 100, that is, a NAND flash memory device, respectively. In the 3D semiconductor memory device 100, cell transistors M0 through Mn may be connected in series to form a cell string S. The cell transistors M0 through Mn may be memory cells. A unit of the cell strings S may be connected in parallel between zeroth through $n^{th}$ bit lines BL0 through BLn and a ground selection line GSL.

The 3D semiconductor memory device 100 may include the cell strings S to which the zeroth through $n^{th}$ cell transistors M0 through Mn are connected in series, zeroth through $n^{th}$ word lines WL0 through WLn for selecting the zeroth through $n^{th}$ cell transistors M0 through Mn, and a row decoder 2 driving the zeroth through $n^{th}$ word lines WL0 through WLn.

The 3D semiconductor memory device 100 may include a string select line SSL connected to one side of the cell strings S and connected to string select transistors ST1, and the zeroth through $n^{th}$ bit lines BL0 through BLn connected to drains of the string select transistors ST1, and a ground select line GSL connected to the other sides of the cell strings S and connected to the ground select transistors ST2. In addition, in the 3D semiconductor memory device 100, a common source line CSL may be connected to sources of the ground select transistors ST2.

The 3D semiconductor memory device 100 may constitute a unit string US by including the cell strings S, and the string select transistor ST1 and the ground select transistor ST2 that are connected to an upper portion and a lower portion of the cell strings S, respectively. In FIGS. 1 and 2, one string select transistor ST1 and one ground select transistor ST2 are illustrated as being connected to the cell string S to form the unit string US, but two or more string select transistors ST1 may be formed, or two or more ground select transistors ST2 may be formed.

In one cell string S, $2^m$ (m is a natural number of 1 or more) cell transistors M0 through Mn may be formed. Two, four, eight, or sixteen cell transistors of the zeroth through nth cell transistors M0 through Mn may be connected in series to one cell string S. In FIGS. 1 and 2, only four cell transistors of the zeroth through $n^{th}$ cell transistors M0 through Mn and four word lines of the zeroth through $n^{th}$ word lines WL0 through WLn are illustrated, for convenience.

In FIG. 2, an X direction (first direction) may be a direction in which the zeroth through $n^{th}$ word lines WL0 through WLn extend, that is, a word line direction. A Y direction (second direction) perpendicular to the X direction (first direction) may be a direction in which the zeroth through $n^{th}$ bit lines BL0 through BLn extend, that is, a bit line direction. A Z direction (third direction) may be a direction perpendicular to a plane that is formed by the zeroth through $n^{th}$ word lines WL0 through WLn and the zeroth through $n^{th}$ bit lines BL0 through BLn. The X and Y directions may be, as described later, structurally the first and second horizontal directions parallel to a surface of a substrate (50 in FIGS. 6, 8 and 9) or a semiconductor layer (103 in FIGS. 6, 8 and 9), respectively, and the Z direction may be a vertical direction perpendicular to the surface of the substrate (50 in FIGS. 6, 8 and 9) or the semiconductor layer (103 in FIGS. 6, 8 and 9).

Figure 3:
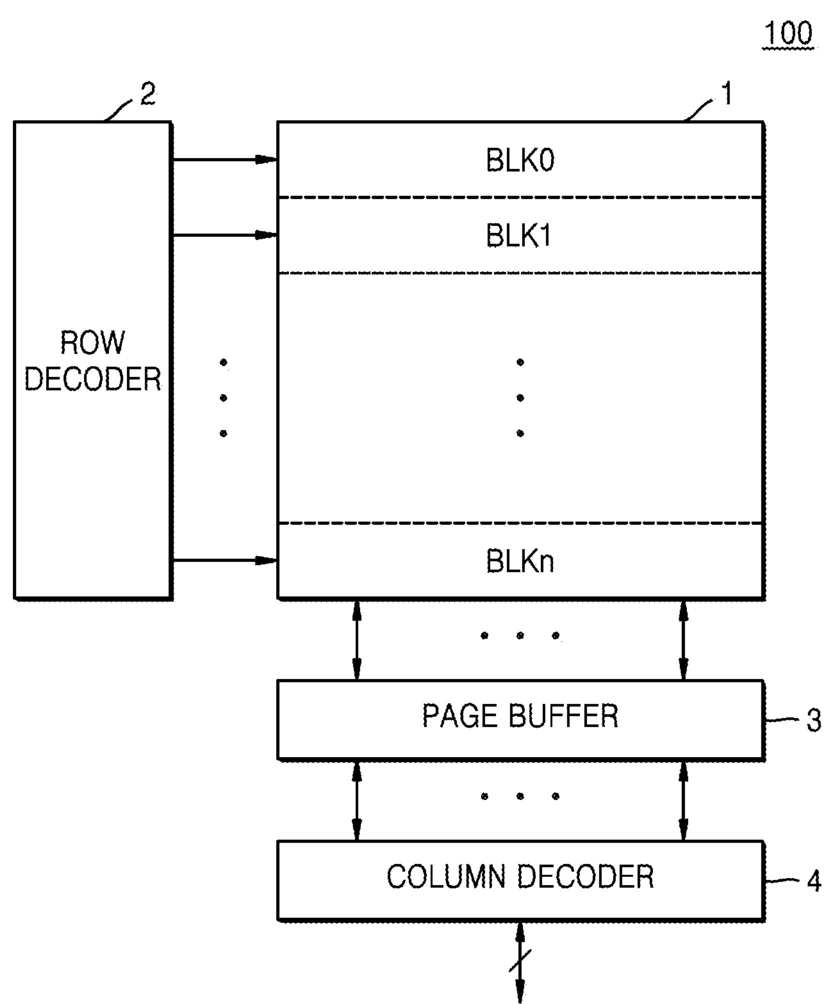
FIG. 3 is a block diagram of components of a 3D semiconductor device, according to some example embodiments of the inventive concepts.

FIG. 3 is a block diagram of components of the 3D semiconductor memory device 100, according to some example embodiments of the inventive concepts.

The 3D semiconductor memory device 100 may include a cell array 1 and peripheral circuits. The peripheral circuits may include the row decoder 2, the page buffer 3, and the column decoder 4.

The cell array 1 may include a 3D cell array including a plurality of memory cells. As described above with respect to FIGS. 1 and 2, the cell array 1 may include memory cells including the zeroth through $n^{th}$ cell transistors M0 through Mn, and the zeroth through $n^{th}$ word lines WL0 through WLn and the zeroth through $n^{th}$ bit lines BL0 through BLn that are electrically connected to the memory cells including the zeroth through $n^{th}$ cell transistors M0 through Mn. In some example embodiments, the cell array 1 may include zeroth through $n^{th}$ memory blocks BLK0 through BLKn that are data erase units.

The row decoder 2 may select word lines (WL0 through WLn in FIGS. 1 and 2) of the cell array 1. The row decoder 2 may select one of the zeroth through $n^{th}$ memory blocks BLK0 through BLKn of the cell array 1 according to address information, and select one of the word lines (WL0 through WLn in FIGS. 1 and 2) of the selected memory block (one of the zeroth through $n^{th}$ memory blocks BLK0 through BLKn). The row decoder 2 may provide a word line voltage generated by a voltage generating circuit (not illustrated) to selected word lines and unselected word lines, respectively, in response to a control of a control circuit (not illustrated).

The page buffer 3 may perform a function of writing information to the memory cells including the cell transistors (M0 through Mn in FIG. 1), or reading information stored in the memory cells including the cell transistors (M0 through Mn in FIG. 1). The page buffer 3 may, according to operation modes, temporarily store data to be stored in the memory cells, or may sense data stored in the memory cells.

The page buffer 3 may operate as a write driver circuit in a program operation mode, and may operate as a sense amplifier circuit in a read operation mode.

The column decoder 4 may be connected to bit lines (BL0 through BLn in FIGS. 1 and 2) of the cell array 1. The column decoder 4 may provide a data transmission path between the page buffer 3 and an external device (for example, a memory controller).

Figure 4:
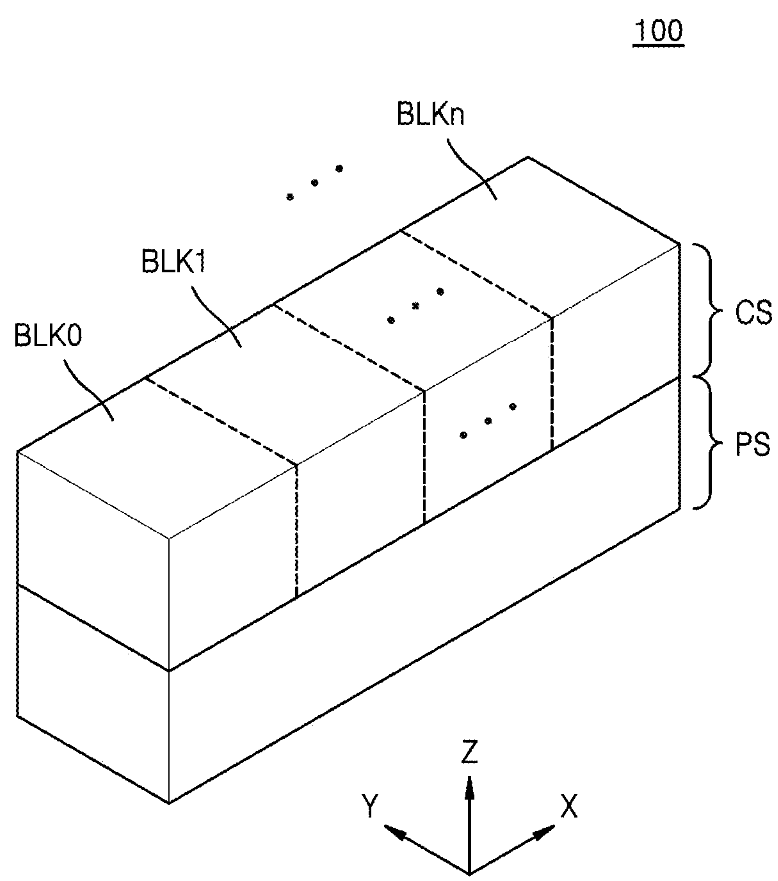
FIG. 4 is a perspective view of a structure of a 3D semiconductor device, according to some example embodiments of the inventive concepts.

FIG. 4 is a perspective view of a structure of the 3D semiconductor memory device 100, according to some example embodiments of the inventive concepts.

The 3D semiconductor memory device 100 may include a peripheral circuit structure PS and a cell array structure CS. The cell array structure CS may be stacked on the peripheral circuit structure PS. The peripheral circuit structure PS may overlap the cell array structure CS in a plan view.

It will be understood that an element that is described to be "on" another element may be above or beneath the other element. Additionally, it will be understood that an element that is described to be "on" another element may be directly on the other element, such that the element is in direct contact with the other element, or indirectly on the other element, such that the element is isolated from direct contact with the other element by one or more interposing spaces and/or structures.

The cell array structure CS may include the cell array (1 of FIG. 3). The cell array structure CS may include the zeroth through $n^{th}$ memory blocks BLK0 through BLKn that are data erase units. Each of the zeroth through $n^{th}$ memory blocks BLK0 through BLKn may include the cell array (1 in FIG. 2) having a 3D structure (or a vertical structure).

The cell array (1 in FIG. 3) may include the zeroth through $n^{th}$ word lines WL0 through WLn and the zeroth through $n^{th}$ bit lines, which are electrically connected to the memory cells including cell transistors (M0 through Mn in FIG. 1) arranged three-dimensionally, as described with reference to FIGS. 1 and 2.

The peripheral circuit structure PS may include a peripheral circuit that controls the cell array 1. The peripheral circuit structure PS may include at least one of the row decoder 2, the page buffer 3, and the column decoder 4, as illustrated in FIG. 3, and may additionally include a control circuit for controlling the zeroth through $n^{th}$ memory blocks BLK0-BLKn.

Below, layouts and structures of 3D semiconductor memory devices according to some example embodiments of the inventive concepts are described. The layouts described below do not limit the inventive concepts. In the following drawings, the same or similar reference numerals denote the same or similar members.

Figure 5:
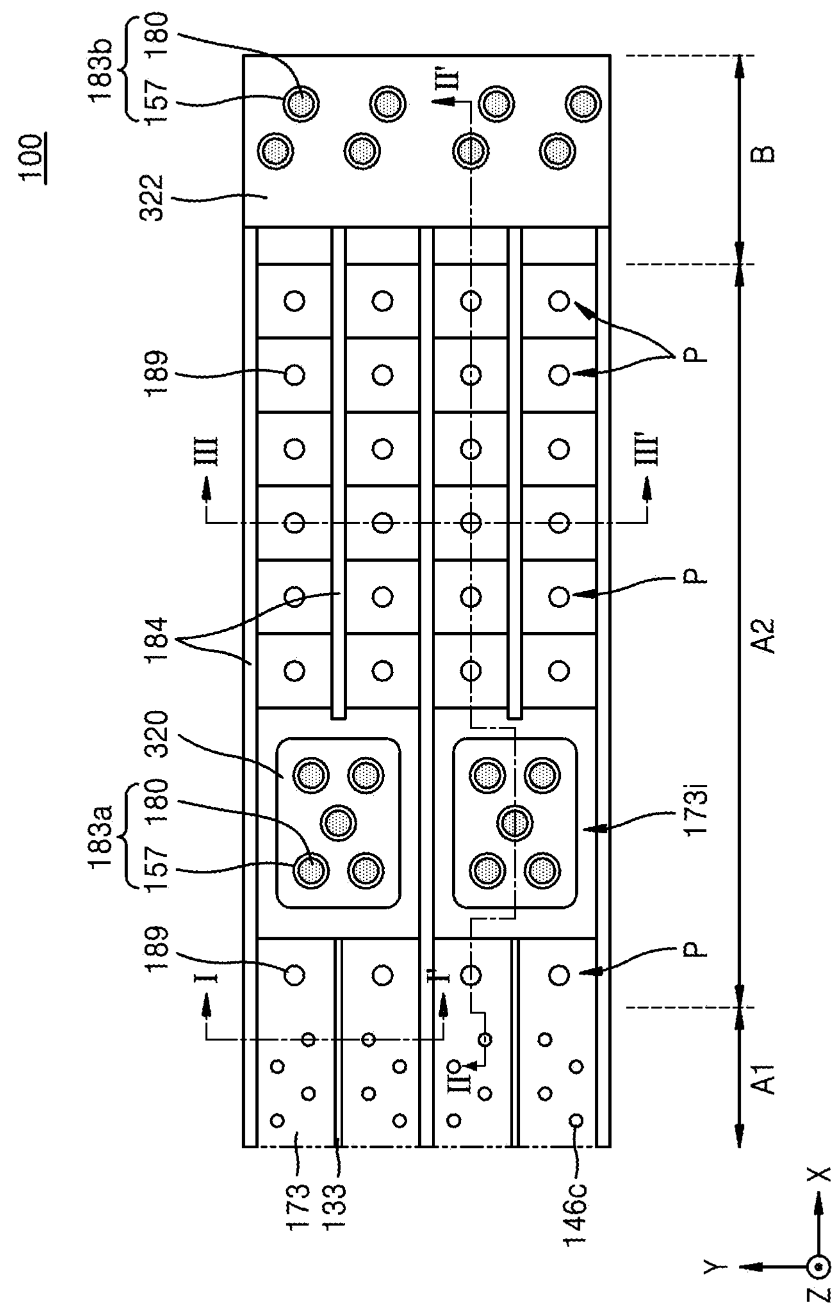
FIG. 5 is a conceptual plan view of a 3D semiconductor device according to some example embodiments of the inventive concepts.
Figure 6:
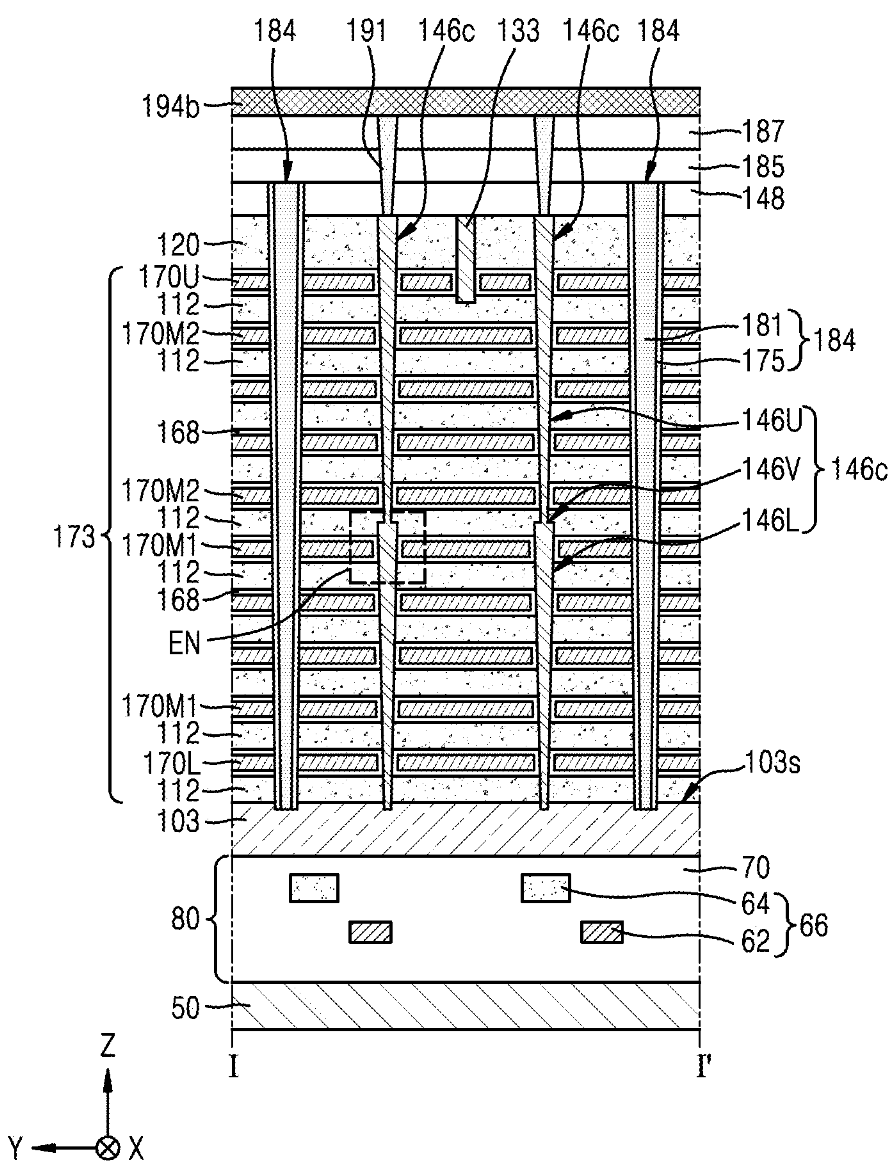
FIG. 6 is a conceptual cross-sectional view of a region taken along line I-I' in FIG. 5.
Figure 7:
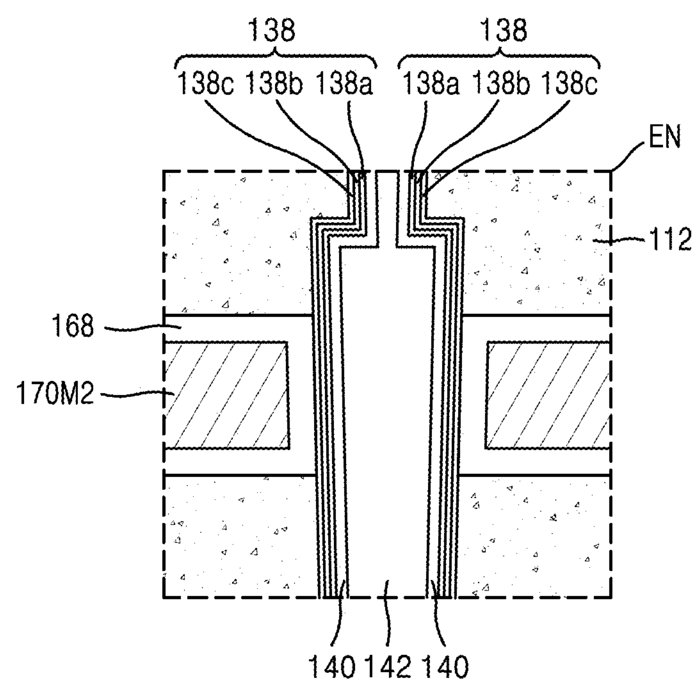
FIG. 7 is an enlarged view of a region EN in FIG. 6.
Figure 8:
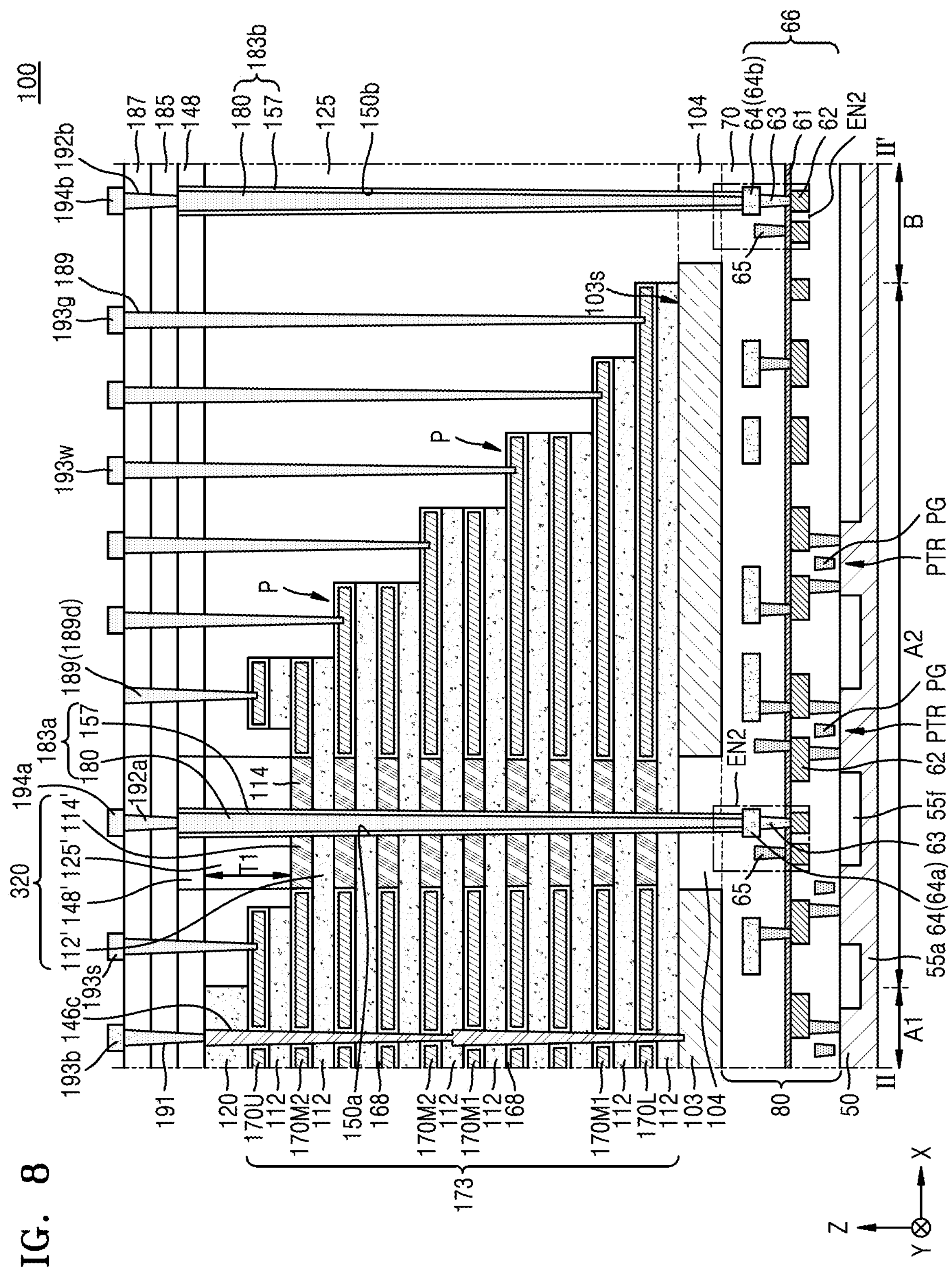
FIG. 8 is a conceptual cross-sectional view of a region taken along line II-IP in FIG. 5.
Figure 9:
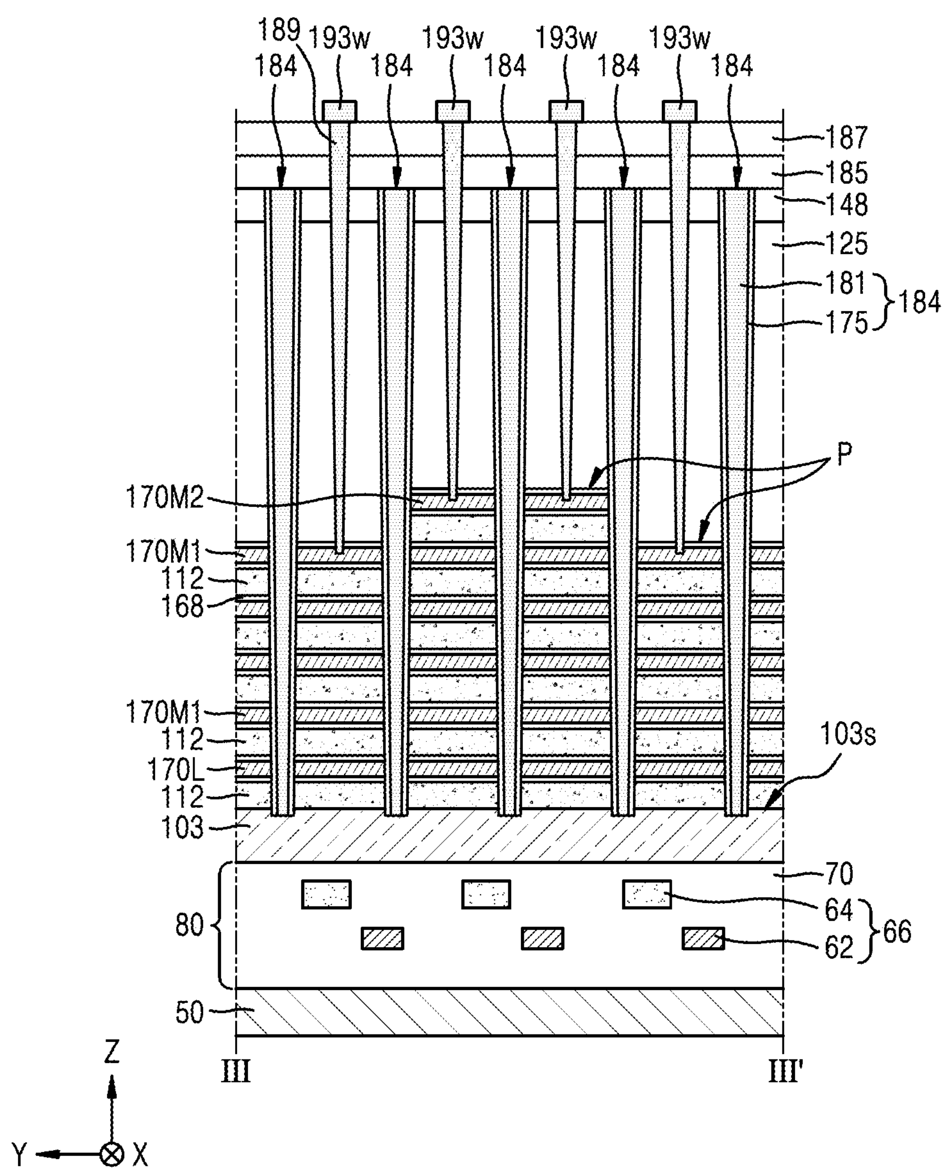
FIG. 9 is a conceptual cross-sectional view of a region taken along line III-III' in FIG. 5.

FIG. 5 is a conceptual plan view of the 3D semiconductor memory device 100 according to some example embodiments of the inventive concepts, FIG. 6 is a conceptual cross-sectional view of a region taken along line I-I' in FIG. 5, FIG. 7 is an enlarged view of a portion EN in FIG. 6, FIG. 8 is a conceptual cross-sectional view of a region taken along line II-IT in FIG. 5, and FIG. 9 is a conceptual cross-sectional view of a region taken along line III-III' in FIG. 5.

The 3D semiconductor memory device 100 according to some example embodiments of the inventive concepts may include a peripheral circuit structure 80 on a substrate 50. The peripheral circuit structure 80 may correspond to the peripheral circuit structure PS in FIG. 4. The substrate 50 may include a semiconductor substrate including a semiconductor material such as silicon. The substrate 50 may be referred to as a lower substrate. For example, the substrate 50 may include a single crystal silicon substrate. The peripheral circuit structure 80 may include at least one of the row decoder 2, the page buffer 3, and the column decoder 4 described with respect to FIG. 3.

The peripheral circuit structure 80 may include peripheral transistors PTR, a contact via 63, a floating via 65, a peripheral wiring level 66, and a lower insulating layer 70. The lower insulating layer 70 may include silicon oxide. In FIGS. 6, 8 and 9, the peripheral circuit structure 80 is illustrated as including the lower insulating layer 70 on the peripheral wiring level 66, but the peripheral circuit structure 80 may be defined up to a top surface of the peripheral wiring level 66.

The peripheral transistors PTR may include active regions 55*a* defined by field regions 55*f* in the substrate 50, and peripheral gates PG on the active regions 55*a*. The peripheral wiring level 66 may include a lower peripheral wiring 62 on the substrate 50, a stopping insulating layer 61 on the lower peripheral wiring 62, an upper peripheral wiring 64, the contact via 63, and the floating via 65. The lower peripheral wiring 62 may be referred to as a lower wiring.

The upper peripheral wiring 64 may be referred to as an upper wiring.

The upper peripheral wiring 64 may be on the contact via 63 and may contact the contact via 63. The contact via 63 may be a conductive via electrically connecting the upper peripheral wiring 64 on the lower peripheral wiring 62. The contact via 63 may be on the lower peripheral wiring 62 and may contact the lower peripheral wiring 62. The contact via 63 may be buried in a third via hole 41 formed in the stopping insulating layer 61 and the first via hole 22 formed in the via insulating layer 16*a*. The contact via 63 may contact the lower peripheral wiring 62 via a third via hole 41 penetrating (e.g., extending through) the stopping insulating layer 61. The third via hole 41 may extend completely through a thickness of the stopping insulating layer 61 in the Z direction. Accordingly, the contact via 63 may contact the lower peripheral wiring 62 through the third via hole 41 extending through the stopping insulating layer 61. The upper peripheral wiring 64, the lower peripheral wiring 62, and the contact via 63 may include a metallic material such as tungsten and copper. The floating via 65 may include a material different from the contact via 63. Restated, the floating via 65 may include a different material from the contact via 63. Further restated, the floating via 65 may include a material that is not included in the contact via 63 and/or the contact via 63 may include a material that is not included in the floating via 65.

The floating via 65 may be on (e.g., directly or indirectly on) the stopping insulating layer 61. The floating via 65 may not contact the lower peripheral wiring 62. Restated, the floating via 65 may be isolated from direct contact with the lower peripheral wiring 62 in the Z direction. For example, the stopping insulating layer 61 may be directly between the floating via 65 and the lower peripheral wiring 62 in the Z direction. The floating via 65 may include a non-conductive via that does not electrically connect the lower peripheral wiring 62 to the upper peripheral wiring 64. The floating via 65 may be on one side of the contact via 63. The floating via 65 may be on only one side of the contact via 63. The floating via 65 may include a polysilicon layer that is not doped with impurities.

The floating via 65, also referred to herein interchangeably as a support via, may be a support structure for preventing a short between peripheral contact via structures 183*a* and 183*b* and the lower peripheral wiring 62. A structure of the peripheral circuit structure 80 and a manufacturing method thereof are described in more detail later.

The semiconductor layer 103 may be on the peripheral circuit structure 80. In some example embodiments, the semiconductor layer 103 may include a silicon layer or a polysilicon layer. In some example embodiments, the semiconductor layer 103 may be referred to as an upper substrate. The semiconductor layer 103 may include a plurality of intermediate insulating layers 104 apart from each other. The intermediate insulating layers 104 may be formed by patterning the semiconductor layer 103 to form an opening, and then filling an insulating layer in the opening. The intermediate insulating layers 104 may include silicon oxide.

A stack structure 173 may be on the semiconductor layer 103 and the intermediate insulating layers 104. The stack structure 173 may include gate horizontal patterns 170L, 170M1, 170M2, and 170U. The gate horizontal patterns 170L, 170M1, 170M2, and 170U may be stacked while being apart from each other in the vertical direction (Z direction) in a first region A1, and may include pad regions P that extend from the first region A1 into a second region A2 in the horizontal direction (X direction) and are in a step shape. The pad regions P are not limited to the step shape illustrated in the drawing, and may be modified in various shapes.

The vertical direction (Z direction) may be a direction perpendicular to an upper surface 103*s* of the semiconductor layer 103, and the first horizontal direction (X direction) may be a direction parallel with or horizontal to the upper surface 103*s* of the semiconductor layer 103. In some example embodiments, the first region A1 may include a cell array area in which the cell array 1 described with reference to FIGS. 2 and 3 is located.

In some example embodiments, the second region A2 may be on either side or both sides of the first region A1. For example, the second regions A2 may be on the right and left sides of the first region A1, respectively. The second region A2 may include a region in which the gate horizontal patterns 170L, 170M1, 170M2, and 170U extend from the first region A1 to form the pad regions P. The second region A2 may include an extended region electrically connected to the cell array region (that is, the first region A1). A third region B on the semiconductor layer 103 on which the gate horizontal patterns 170L, 170M1, 170M2, and 170U are not formed may be referred to as a peripheral region.

The gate horizontal patterns, such as 170L, 170M1, 170M2, and 170U, may include the lower gate horizontal pattern 170L, the upper gate horizontal pattern 170U on the lower gate horizontal pattern 170L, and the intermediate gate horizontal patterns 170M1 and 170M2 between the lower gate horizontal pattern 170L and the upper gate horizontal pattern 170U. In FIG. 8, for convenience, four of the intermediate gate horizontal patterns 170M1 and 170M2 are stacked, respectively, but dozens or hundreds of them may be stacked as needed.

The gate horizontal patterns, such as 170L, 170M1, 170M2, and 170U, may be in the first region A1, and may extend from the first region A1 into the second region A2. The pad regions P may be defined as regions that do not overlap with horizontal patterns located relatively above the gate horizontal patterns, such as 170L, 170M1, 170M2, and 170U.

In some example embodiments, the pad areas P may have a shape in which a plurality of steps are sequentially arranged while moving away from the first area A1 when viewed in the first horizontal direction (X direction) as illustrated in FIG. 8. When viewed in the second horizontal direction (Y direction) as illustrated in FIG. 9, the pad regions P may have a shape in which steps are arranged on both sides based on any one of the separation structures 184. The second horizontal direction (Y direction) may be parallel or horizontal with the upper surface 103*s* of the semiconductor layer 103 and may be perpendicular to the first horizontal direction (X direction). The pad regions P may be modified and arranged in various shapes including the step shape illustrated in FIGS. 8 and 9.

The intermediate gate horizontal patterns, such as 170M1 and 170M2, may include first intermediate gate horizontal patterns 170M1 and second intermediate gate horizontal patterns 170M2 on the first intermediate gate horizontal patterns 170M1. In some example embodiments, as illustrated in FIG. 8, at an intermediate portion of the intermediate gate horizontal patterns, such as 170M1 and 170M2, that is, at a portion where the first intermediate gate horizontal patterns 170M1 contact the second intermediate gate horizontal patterns 170M2, widths in the first horizontal direction X are configured different, but may be configured the same. The upper gate horizontal patterns 170U in the first region A1 and the second region A2 may be separated by the insulating pattern 133 in the second horizontal direction (Y direction). The insulating pattern 133 may include silicon oxide.

The gate horizontal patterns, such as 170L, 170M1, 170M2, and 170U, may include gate electrodes. The lower gate horizontal pattern 170L may be the ground select line GSL described with respect to FIG. 2. The upper gate horizontal pattern 170U may be the string select line SSL described with respect to FIG. 2. In some example embodiments, the intermediate gate horizontal patterns, such as 170M1 and 170M2, may be the word lines WL described with respect to FIGS. 1 and 2.

The stack structure 173 may include interlayer insulating layers 112. The interlayer insulating layers 112 may be stacked repeatedly and alternately with the gate horizontal patterns 170L, 170M1, 170M2, and 170U. For example, the interlayer insulating layers 112 may be under each of the gate horizontal patterns 170L, 170M1, 170M2, and 170U. The interlayer insulating layers 112 may include silicon oxide.

The first upper insulating layer 120 and second upper insulating layers 125 and 125' may be disposed in the first region A1, the second region A2, and the third region B. The first upper insulating layer 120 and the second upper insulating layers 125 and 125' may include silicon oxide. Top surfaces of the first upper insulating layer 120 and the second upper insulating layers 125 and 125' may have the same plane.

The first upper insulating layer 120 may be in the first region A1 and the second upper insulating layers 125 and 125' may be in regions other than the first region A1 that is, in the second region A2 and the third region B. The stack structure 173 in the first region A1 may be covered by the first upper insulating layer 120, and the stack structure 173 in the second region A2 may be covered by the second upper insulating layers 125' and 125. Only the second upper insulating layer 125 may be covered in the third region B.

In the second region A2, a first through region 320 including the second upper insulating layer 125' and mold structures 112' and 114' may be arranged. In a broad sense, the first through region 320 may include the intermediate insulating layer 104. The mold structures 112' and 114' may include the interlayer insulating layer 112 and the mold insulating layer 114, respectively. A first peripheral contact via structure 183*a* in the first through region 320 may penetrate through the second upper insulating layer 125', the mold structures 112' and 114', and the intermediate insulating layer 104, and may extend in the vertical direction (Z direction). The first through region 320 may include silicon oxide. A thickness of the second upper insulating layer 125' in the first through region 320 may be Tl.

On the first upper insulating layers 120 and the second upper insulating layers 125 and 125', a plurality of capping insulating layers may be arranged. The plurality of capping insulating layers may include first capping insulating layers 148 and 148', a second capping insulating layer 185, and a third capping insulating layer 187, which are sequentially stacked. Each of the first capping insulating layers 148, and 148', the second capping insulating layer 185, and the third capping insulating layer 187 may include an oxide-based insulating material, for example, silicon oxide. In a broad sense, the first through region 320 may include the mold structures 112' and 114', the second upper insulating layer 125', and the first capping insulating layer 148'.

In the first region A1, vertical channel structures 146*c* penetrating the stack structure 173 may be arranged. The vertical channel structures 146*c* may penetrate the stack structure 173 and extend in the vertical direction (Z direction) to penetrate the first upper insulating layer 120. A first peripheral contact via structure 183*a* may be on a first peripheral pad portion 64*a* of the upper peripheral wiring 64.

The first peripheral contact via structure 183*a* in the first through region 320 may contact the first peripheral pad portion 64*a* of the upper peripheral wiring 64. The first through region 320 may extend in the negative vertical direction (Z direction) to sequentially penetrate the lower insulating layer 70, the intermediate insulating layer 104, the mold structures 112' and 114', the second upper insulating layer 125', and the first capping insulating layer 148'.

In the third region B, a second through region 322 may be arranged. The second through region 322 may be apart from the first through region 320 in the first horizontal direction. The second peripheral contact via structure 183*b* in the second through region 322 may sequentially penetrate the lower insulating layer 70, the intermediate insulating layer 104, the second upper insulating layer 125, and the first capping insulating layer 148 and may extend in the vertical direction (Z direction).

As described above, the second peripheral contact via structure 183*b* may be in the second through region 320. The second peripheral contact via structure 183*b* may contact a second peripheral pad portion 64*b* of the upper peripheral wiring 64. The second peripheral contact via structure 183*b* may contact the second peripheral pad portion 64*b* of the upper peripheral wiring 64.

The first peripheral contact via structure 183*a* and the second peripheral contact via structure 183*b* may have the same cross-sectional structure and the same planar shape. For example, each of the first peripheral contact via structure 183*a* and the second peripheral contact via structure 183*b* may include a through via 180 and a contact spacer 157 surrounding side surfaces of the through via 180. The through via 180 may be a conductive pillar. The through via 180 may include a metal nitride such as TiN and/or a metal such as tungsten. The contact spacer 157 may include silicon oxide.

Upper surfaces of the first peripheral contact via structure 183*a* and the second peripheral contact via structure 183*b* may be coplanar. Top surfaces of the first and second peripheral contact via structures 183*a* and 183*b* may have the same height from the upper surface 103*s* of the semiconductor layer 103.

The first peripheral contact via structure 183*a* may be in a first peripheral contact hole 150*a*. The first peripheral contact hole 150*a* may be formed by selectively etching the first capping insulating layer 148' and a second upper insulating layer 125' constituting the first through region 320, and the intermediate insulating layer 104 and the lower insulating layer 70. The second peripheral contact via structure 183*b* may be in the second peripheral contact hole 150*b*. The second peripheral contact hole 150*b* may be formed by selectively etching the first capping insulating layer 148 and the second upper insulating layer 125 constituting the second through region 322, and the intermediate insulating layer 104 and the lower insulating layer 70.

The first peripheral contact hole 150*a* and the second peripheral contact hole 150*b* may be formed simultaneously during a manufacturing process. Descriptions of the first peripheral contact hole 150*a* and the second peripheral contact hole 150*b*, the first peripheral contact via structure 183*a*, and the second peripheral contact via structure 183*b* are provided in more detail later.

The vertical channel structures 146*c* penetrating the stack structure 173 may be in the first region A1. The vertical channel structure 146*c* may include a lower vertical region 146L, an upper vertical region 146U on the lower vertical region 146L, and a width variation region 146V between the lower vertical region 146L and the upper vertical region 146U.

Each of the lower vertical regions 146L and the upper vertical regions 146U may have a tendency to have increasing widths away from the upper surface 103*s* of the semiconductor layer 103 in the vertical direction (Z direction). Accordingly, the upper region of the lower vertical region 146L may have a greater width than the lower region of the upper vertical region 146U. A width variation region 146V may be a region where the width of the vertical channel structure 146*c* changes from a relatively large width of the upper region of the lower vertical region 146L to a relatively small width of the lower region of the upper vertical region 146U.

The vertical channel structure 146*c* may include a buried insulating layer 142, a channel semiconductor layer 140, and a gate dielectric structure 138 between the channel semiconductor layer 140 and the stack structure 173. The gate dielectric structure 138 may include a tunnel dielectric layer 138*a*, an information storage layer 138*b*, and a blocking dielectric layer 138*c*. The tunnel dielectric layer 138*a* may include silicon oxide and/or silicon oxide doped with impurities. The blocking dielectric layer 138*c* may include silicon oxide and/or a high-k dielectric material. The information storage layer 138*b* may include a material capable of storing information, for example, silicon nitride.

The vertical channel structures 146*c* may penetrate the stack structure 173, and extend in the vertical direction (Z direction) to penetrate the first upper insulating layer 120. The separation structures 184 may be on the semiconductor layer 103. In some example embodiments, the separation structures 184 may penetrate the stack structure 173.

The separation structures 184 may penetrate the stack structure 173 in the first region A1, extend in the vertical direction (Z direction), and penetrate the first upper insulating layer 120 and the first capping insulating layer 148. The separation structures 184 may extend in the first horizontal direction (X direction), and separate or isolate the stack structure 173 in the second horizontal direction (Y direction).

Between the separation structures 184 crossing the first region A1 and the second region A2, the stack structure 173 may not be completely cut by the first through region 320 in the second region A2, and may be continuously connected to each other via a connection region 173*i* around the first through region 320. For example, the gate horizontal patterns having pad regions in the second region A2, that is, the first and second intermediate gate horizontal patterns 170M1 and 170M2, and the lower gate horizontal pattern 170L may be continuously extended from the pad regions P to the first region A1 by passing around the first through region 320, that is, the connection region 173*i*.

Each of the separation structures 184 may include a separation core pattern 181 and a separation spacer 175 on a side surface of the separation core pattern 181. The separation core pattern 181 may include a conductive material. In some example embodiments, the separation core pattern 181 may be a common source line. The separation spacer 175 may include an insulating material. For example, the separation spacer 175 may include silicon oxide.

The stack structure 173 may include a dielectric layer 168 that covers upper and lower surfaces of the gate horizontal patterns, such as 170L, 170M1, 170M2, and 170U, and extends to some side surfaces of the gate horizontal patterns. The dielectric layer 168 may include a high-k dielectric such as aluminum oxide.

Bit line contact plugs 191 on the vertical channel structures 146*c*, gate contact plugs 189 on the pad regions P of the gate horizontal patterns 170L, 170M1, 170M2, and 170U, a first peripheral contact plug 192*a* on the via structure 183*a*, and a second peripheral contact plug 192*b* on the second peripheral contact via structure 183*b* may be arranged. On the third capping insulating layer 187, bit lines 193*b*, string select gate connection wiring 193*s*, word line connection wiring 193*w*, ground select gate connection wiring 193*g*, first peripheral connection wiring 194*a*, and the second peripheral connection wiring 194*b* may be arranged.

The bit lines 193*b* may be electrically connected to the vertical channel structures 146*c* via bit line contact plugs 191. The string select gate connection wiring 193*s* may be electrically connected to the upper gate horizontal pattern 170U via the gate contact plug 189 on the pad region P of the upper gate horizontal pattern 170U.

The word line connection wirings 193*w* may be electrically connected to the first and second intermediate gate horizontal patterns 170M1 and 170M2 via the gate contact plugs 189 on the first and second intermediate gate horizontal patterns 170M1 and 170M2. The ground select gate connection wiring 193*g* may be electrically connected to the lower gate horizontal pattern 170L via the gate contact plug 189 on the pad region P of the lower gate horizontal pattern 170L. In some example embodiments, the gate contact plug 189 connected to the upper gate horizontal pattern 170U may include a dummy gate contact plug 189*d*.

The first peripheral connection wire 194*a* may be connected to at least some of the string select gate connection wiring 193*s* and the word line connection wirings 193*w*. The second peripheral connection wire 194*b* may be connected to at least some of the ground select gate connection wiring 193*g* and the word line connection wirings 193*w*. The word line connection wirings 193*w* may be connected to the peripheral circuit structure 80 via the first peripheral connection wiring 194*a* and the second peripheral connection wiring 194*b*.

Figure 10:
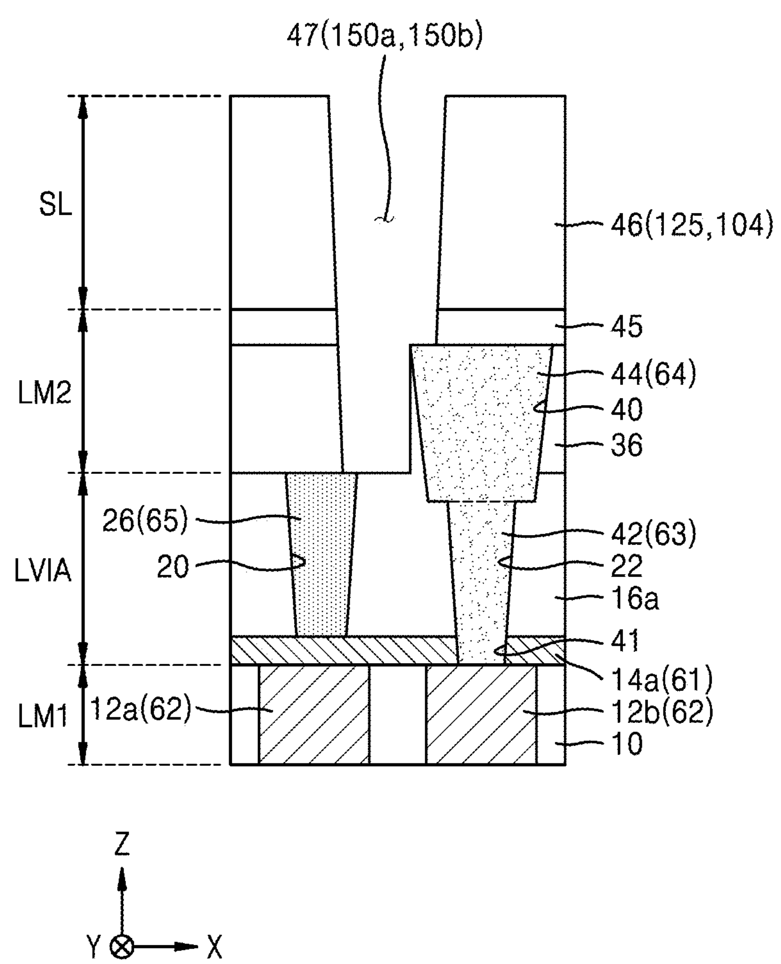
FIGS. 10 and 11 are cross-sectional views of peripheral circuit structures of a 3D semiconductor device, according to some example embodiments of the inventive concepts.
Figure 11:
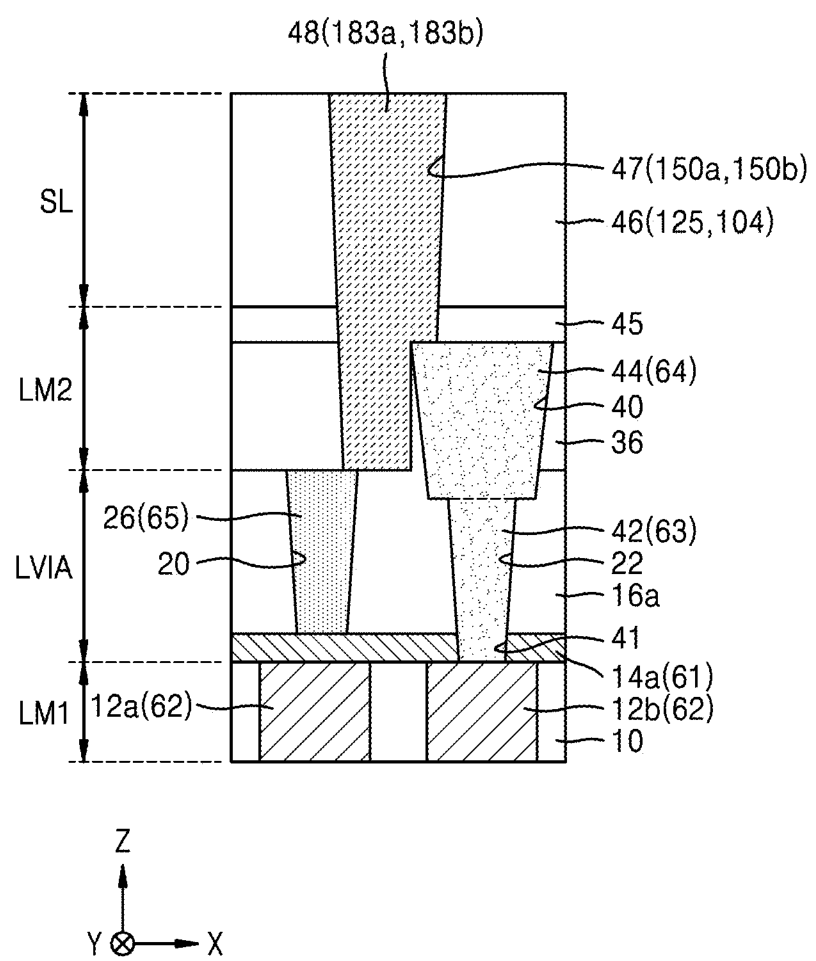

FIGS. 10 and 11 are cross-sectional views of peripheral circuit structures of a 3D semiconductor device, according to some example embodiments of the inventive concepts.

FIGS. 10 and 11 are views of a portion EN2 of the peripheral circuit structure 80 in FIG. 8. FIGS. 10 and 11 are views of the portion EN2 in the region A1 or the region B of the peripheral circuit structure 80 in FIG. 8. In addition, FIGS. 10 and 11 may be used not only for a structure of the peripheral circuit structure 80 described above but also for a structure of a general-purpose semiconductor device.

The peripheral circuit structure (80 in FIG. 8) may include a first wiring level LM1, a via wiring level LVIA, and a second wiring level LM2. The cell array structure level SL may be on the second wiring level LM2.

The first wiring level LM1 may include a first lower wiring 12*a* on the substrate (50 in FIGS. 6, 8, and 9), a second lower wiring 12*b* that is also on the substrate and that is away from (e.g., isolated from direct contact with) the first lower wiring 12*a* in a horizontal direction, for example, in the X direction and positioned adjacent to one side of the first lower wiring 12*a* in the horizontal direction, and the first insulating layer 10. The first insulating layer 10 may be between the first and second lower wirings 12*a* and 12*b* in the horizontal direction (e.g., X direction and/or Y direction) and may insulate (e.g., electrically insulate) the first lower wiring 12*a* from the second lower wiring 12*b*. The first wiring level LM1 may include the first lower wiring 12*a*, and the second lower wiring 12*b* adjacent to the one side (e.g., only one side) and away from the first lower wiring 12*a* in a horizontal direction, for example, the X direction. The first lower wiring 12*a* may be horizontally positioned (e.g., arranged horizontally) on one side (e.g., only one side) of the contact via 42 to be described later. The first lower wiring may be isolated from direct contact with both the contact via 42 and the second lower wiring 12*b* in a horizontal direction (e.g., X direction) and may be on, in the X direction, one side (e.g., only one side) of each of the contact via 42 and the second lower wiring 12*b*.

The first lower wiring 12*a* and the second lower wiring 12*b* may correspond to the lower peripheral wiring 62 in FIGS. 6, 8, and 9. The first insulating layer 10 may be included in the lower insulating layer 70 in FIGS. 6, 8, and 9.

The via wiring level LVIA may include a stopping insulating layer 14*a* on both the first lower wiring 12*a* and the second lower wiring 12*b* and further on the first insulating layer 10, a floating via 26, a contact via 42 on the second lower wiring 12*b* and contacting the second lower wiring 12*b*, and a via insulating layer 16*a*. The floating via 26 may correspond to the floating via 65 in FIGS. 6, 8, and 9. The contact via 42 may correspond to the contact via 63 in FIGS. 6, 8, and 9. The via insulating layer 16*a* may be included in the lower insulating layer 70 in FIGS. 6, 8, and 9.

The floating via 26 may be buried in the floating via hole 20 formed in the via insulating layer 16*a* on the stopping insulating layer 14*a*. The floating via 26, also referred to herein as a first floating via 26, may be aligned (e.g., may at least partially overlap) with the first lower wiring 12*a* in the Z direction, as shown in at least FIG. 11. The floating via 26 may be formed on the stopping insulating layer 14*a*, and may not electrically contact the first lower wiring 12*a* and the second lower wiring 12*b*. The floating via 26 may be on (e.g., directly or indirectly on) the stopping insulating layer 14*a*. The floating via 26 may not contact the first lower wiring 12*a* or the second lower wiring 12*b*. Restated, the floating via 26 may be isolated from direct contact with the first lower wiring 12*a* in the Z direction and may be isolated form direct contact with the second lower wiring 12*b* in the Z direction, for example isolated from said direct contact by at least the stopping insulating layer 14*a*. For example, the stopping insulating layer 14*a* may be directly between the floating via 26 and the first lower wiring 12*a* in the Z direction.

In some example embodiments, the floating via 26 may include (e.g., partially or completely comprise) a non-conductive material, for example, a polysilicon layer that is not doped with impurities (e.g., a polysilicon layer that includes no impurities doped thereon). Restated, the floating via 26 may partially or completely comprise a polysilicon layer that is not doped with any impurities. In some example embodiments, the floating via 26 may include (e.g., partially or completely comprise) a conductive material considering a thickness (distance) of the stopping insulating layer 14*a*, and a separation distance between the first lower wiring 12*a* and the second lower wiring 12*b* in the horizontal direction.

The contact via 42 may be buried in a third via hole 41 formed in the stopping insulating layer 14*a* (also referred to herein as a first stopping insulating layer) and the first via hole 22 formed in the via insulating layer 16*a*. The via insulating layer 16*a* may be at least partially between the contact via 42 and the floating via 26 in a horizontal direction (e.g., the X direction and/or Y direction) and may insulate (e.g., electrically insulate) the contact via 42 from the floating via 26. The contact via 42 may be aligned (e.g., may at least partially overlap) with the second lower wiring 12*b* in the Z direction, as shown in at least FIG. 11. The stopping insulating layer 14*a* may expose the second lower wiring 12*b*, for example via the third via hole 41. The contact via may include (e.g., partially or completely comprise) a conductive material. The contact via 42 may contact the second lower wiring 12*b* via the third via hole 41 penetrating (e.g., extending through) the stopping insulating layer 14*a*. The third via hole 41 may extend completely through a thickness of the stopping insulating layer 14*a* in the Z direction. Accordingly, the contact via 42 (which may correspond to contact via 63) may contact the second lower wiring 12*b* (which may correspond to lower peripheral wiring 62) through the third via hole 41 extending through the stopping insulating layer 14*a* (which may correspond to the stopping insulating layer 61). The contact via 42 may include a material different from the floating via 26. Restated, the floating via 26 may include a different material from the contact via 42. Further restated, the floating via 26 may include a material that is not included in the contact via 42 and/or the contact via 42 may include a material that is not included in the floating via 26.

The second wiring level LM2 may be on the contact via 42 and may include a second insulating layer 36, an upper wiring 44, and a third insulating layer 45. The upper wiring 44 may correspond to the upper peripheral wiring 64 in FIGS. 6, 8, and 9. The second insulating layer 36 and the third insulating layer 45 may be included in the lower insulating layer 70 in FIGS. 6, 8, and 9.

The upper wiring 44 may be on the contact via 42. The upper wiring 44 may contact the contact via 42. The upper wiring 44 may be formed by being buried in the second via hole 40 formed in the second insulating layer 36. The upper wiring 44 may be one body with the contact via 42 (e.g., the upper wiring 44 and the contact via 42 may be separate portions of a single piece of material). The second insulating layer 36 may surround the upper wiring 44 (e.g., in a horizontal plane that extends in the X direction and the Y direction). A third insulating layer 45 may be on the upper wiring 44.

As described above, the cell array structure level SL may be on the second wiring level LM2. The cell array structure level SL may include the fourth insulating layer 46. The fourth insulating layer 46 may include the intermediate insulating layer 104 or the second upper insulating layer 125 in FIGS. 6, 8, and 9.

As illustrated in FIG. 10, a contact hole 47 connected to the second wiring level LM2 from the cell array structure level SL may be formed. In other words, the contact hole 47 for connecting to the upper wiring 44 of the second wiring level LM2 from the cell array structure level SL may be formed. The contact hole 47 may correspond to the first and second peripheral contact holes 150*a* and 150*b* in FIGS. 6, 8, and 9.

The contact hole 47 may, when accurately aligned onto the upper wiring 44, be formed after penetrating through the fourth insulating layer 46 and the third insulating layer 45. However, the contact hole 47 is formed by penetrating the fourth insulating layer 46, the third insulating layer 45, and the second insulating layer 36 due to errors or limitations in the photographic process. When the contact hole 47 is formed, the floating via 26 may cause the contact hole 47 to pass through the via insulating layer 16*a* and the stopping insulating layer 14*a*, and thus not to expose the first lower wiring 12*a* or the second lower wiring 12*b*.

In other words, the contact hole 47 connected to the second wiring level LM2 from the cell array structure level SL may have a very large aspect ratio. Accordingly, when there is no floating via 26, the contact hole 47 may penetrate the via insulating layer 16*a* and the stopping insulating layer 14*a*, and then expose the first lower wiring 12*a* or the second lower wiring 12*b*. However, in the inventive concepts, by providing the floating via 26, a possibility that the contact hole 47 connected to the second wiring level LM2 from the cell array structure level SL exposes the first lower wiring 12*a* or the second lower wiring 12*b* may be reduced.

As illustrated in FIG. 11, the contact via structure 48 may be formed in the contact hole 47. The contact via structure 48 may be understood to be on the floating via 26 and the second wiring level LM2. The contact via structure 48 may be on (e.g., directly or indirectly on) one or both of the floating via 26 and the upper wiring 44. The contact via structure 48 may be electrically connected to the upper wiring 44 of the second wiring level LM2 from the cell array structure level SL. The contact via structure 48 may contact the floating via 26 and may not contact the upper wiring 44. The contact via structure 48 may contact both the upper wiring 44 and the floating via 26. The contact via structure 48 may correspond to the peripheral contact via structures 183*a* and 183*b* in FIGS. 6, 8, and 9.

FIG. 8 illustrates that the peripheral contact via structures 183*a* and 183*b* are accurately aligned on the upper peripheral wiring 64. FIGS. 10 and 11 illustrate a case where the contact via structure 48 is not accurately aligned on the upper wiring 44.

Figure 12:
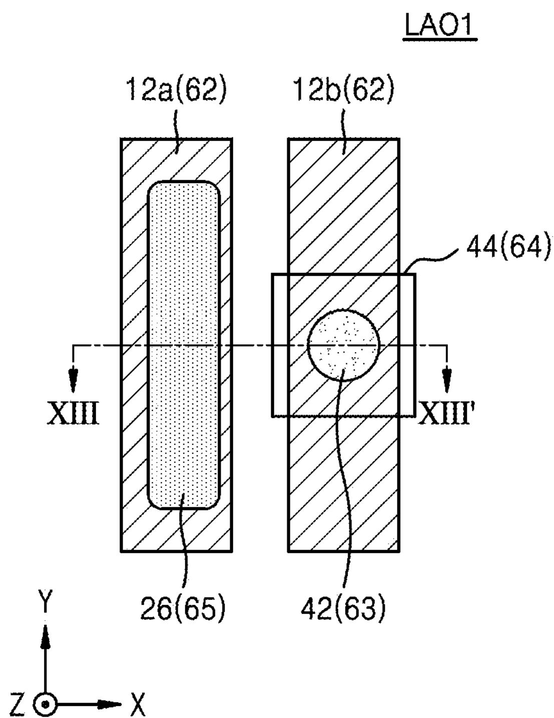
FIG. 12 is a layout diagram of a peripheral circuit structure of a 3D semiconductor device, according to some example embodiments of the inventive concepts.
Figure 13:
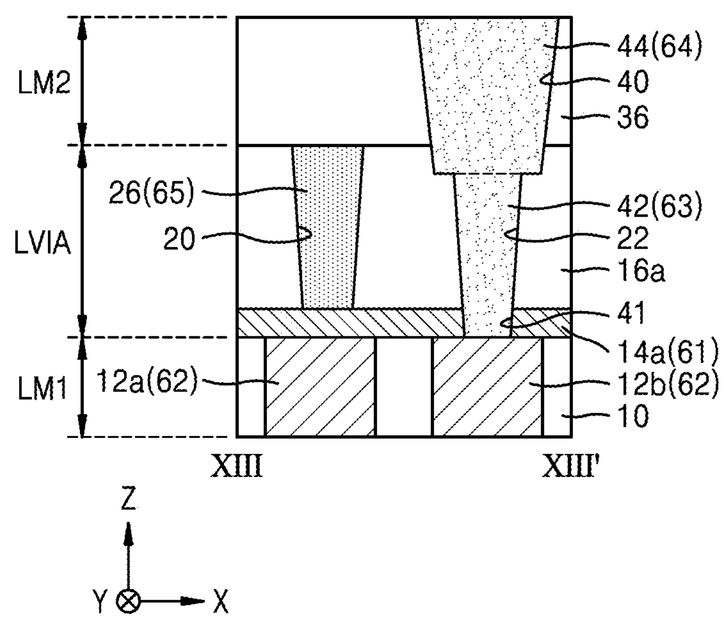
FIG. 13 is a cross-sectional view of a main portion taken along line XIII-XIII' in FIG. 15.

FIG. 12 is a layout diagram of the peripheral circuit structure 80 of a 3D semiconductor memory device according to some example embodiments of the inventive concepts, and FIG. 13 is a cross-sectional view of main components taken along line XIII-XIII' in FIG. 12.

FIG. 12 may illustrate a layout diagram LAO1 of the peripheral circuit structure 80 in FIGS. 6, 8, and 9. FIG. 13 is a cross-sectional view of main components taken along line XIII-XIII' of FIG. 12, and may be a partial cross-sectional view of diagrams of FIGS. 10 and 11. In FIGS. 12 and 13, the same descriptions given with reference to FIGS. 10 and 11 are briefly given or omitted.

As illustrated in FIG. 12, the peripheral circuit structure (80 in FIGS. 6, 8, and 9) may include the first lower wiring 12*a* and the second lower wiring 12*b* that is adjacent to and apart from the first lower wiring 12*a* in the X direction. The first lower wiring 12*a* and the second lower wiring 12*b* may include a line-type wiring arranged in a line shape extending in one direction, for example, in the Y direction. A wiring having a line shape may have a thickness in one direction (e.g., the Y direction) and a length in a perpendicular direction (e.g., the X direction) that is substantially larger in magnitude than the thickness (e.g., the length of a line shape wiring may be at least 10 times the thickness of the line shape wiring). As described above, the first lower wiring 12*a* and the second lower wiring 12*b* may correspond to the lower peripheral wiring 62 in FIGS. 6, 8, and 9.

The floating via 26 may be on the first lower wiring 12*a*. The floating via 26 may not contact the first lower wiring 12*a*. As described above, the floating via 26 may correspond to the floating via 65 in FIGS. 6, 8, and 9.

The contact via 42 and the upper wiring 44 may be on the second lower wiring 12*b*. The upper wiring 44 may contact the second lower wiring 12*b* via the contact via 42. As described above, the contact via 42 may correspond to the contact via 63 in FIGS. 6, 8, and 9. As described above, the upper wiring 44 may correspond to the upper peripheral wiring 64 in FIGS. 6, 8, and 9.

As illustrated in FIG. 13, the peripheral circuit structure (80 in FIGS. 6, 8, and 9) may include the first wiring level LM1, the via wiring level LVIA, and the second wiring level LM2 described with reference to FIGS. 10 and 11. In FIG. 13, for convenience, only the second wiring level LM2 including the upper wiring 44 and the second insulating layer 36 is illustrated. A manufacturing method of the peripheral circuit structure (80 in FIGS. 6, 8, and 9) in FIG. 13 is described in more detail later.

Figure 14:
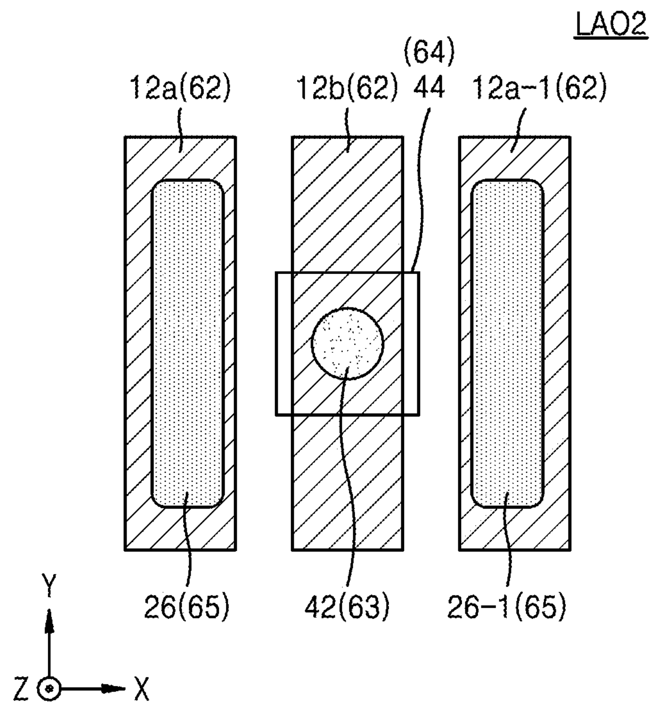
FIG. 14 is a layout diagram of a peripheral circuit structure of a 3D semiconductor device, according to some example embodiments of the inventive concepts.

FIG. 14 is a layout diagram of a peripheral circuit structure LAO2 of a 3D semiconductor device, according to some example embodiments of the inventive concepts;

In FIG. 14, the same or similar reference numerals as those in FIG. 12 may denote the same members. The layout diagram LAO2, as compared with the layout diagram LAO1 in FIG. 12, may be the same as the layout diagram LAO1 except that a third lower wiring 12*a*-1 and a second floating via 26-1 are further formed on one side of the second lower wiring 12*b*. The second floating via 26-1 may be on (e.g., directly or indirectly on) the stopping insulating layer 14*a* may be aligned (e.g., may at least partially overlap) with the third lower wiring 12*a*-1 in the Z direction.

In the layout diagram LAO2 of FIG. 14, the first lower wiring 12*a* and the third lower wiring 12*a*-1 may be on both sides (e.g., opposite sides) of the second lower wiring 12*b* in the X direction. The first floating via 26 and the second floating via 26-1 may be on (and may at least partially overlap) the first lower wiring 12*a* and the third lower wiring 12*a*-1 in the Z direction, respectively.

The first floating via 26 may be on one side (e.g., only one side) of the contact via 42 in the X direction, and the second floating via 26-1 may be on the other side (e.g., on only the other side) of the contact via 42 in the horizontal direction, e.g., in the X direction. In other words, the first floating via 26 and the second floating via 26-1 may be on both sides (e.g., may be on opposite sides) of the contact via 42 in the horizontal direction, e.g., in the X direction, such that the contact via 42 is between the first floating via 26 and the second floating via 26-1 in the horizontal direction, that is, in the X direction. The first floating via 26 and the second floating via 26-1 may not contact (e.g., may be isolated from direct contact with) the first lower wiring 12*a* and the third lower wiring 12*a*-1, respectively, in the vertical direction, that is, in the Z direction.

Accordingly, as previously described with reference to FIGS. 10 and 11, the contact via structure (48 in FIGS. 10 and 11) formed on the upper wiring 44 may not contact the second lower wiring 12*b* due to the first floating via 26 and the second floating via 26-1.

Figure 15:
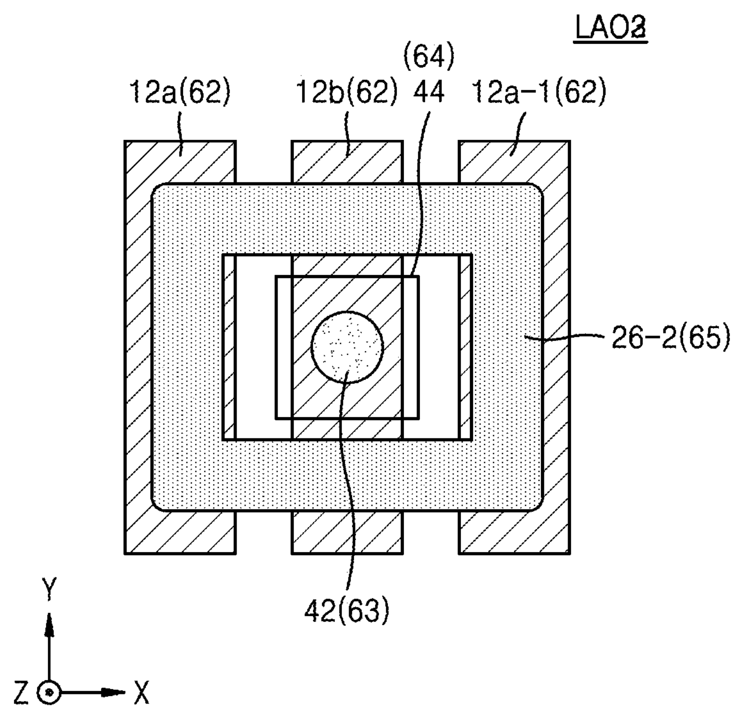
FIG. 15 is a layout diagram of a peripheral circuit structure of a 3D semiconductor device, according to some example embodiments of the inventive concepts.

FIG. 15 is a layout diagram LAO3 of a peripheral circuit structure of a 3D semiconductor device, according to some example embodiments of the inventive concepts.

In FIG. 15, the same or similar reference numerals as those in FIGS. 12 and 14 may denote the same members. The layout diagram LAO3 may be the same as the layout diagram LAO1 of FIG. 14 except that a third floating via 26-2 surrounds the contact via 42 (e.g., surrounds the contact via 42 in a horizontal plane, such as a plane extending in the X and Y directions).

In the layout diagram LAO3, the third floating via 26-2 may surround the contact via 42 on the first lower wiring 12*a*, the second lower wiring 12*b*, and the third lower wiring 12*a*-1. The third floating via 26-2 may be connected to the first floating via (26 in FIG. 14). In some example embodiments, the first floating via 26 may be considered to be a portion of a third floating via 26-2 that is a single piece of material; accordingly, the third floating via 26-2 may be understood to, in some example embodiments, include the first floating via 26 as a portion of the third floating via 26-2. The third floating via 26-2 may at least partially overlap first lower wiring 12*a*, the second lower wiring 12*b*, and the third lower wiring 12*a*-1 in the vertical direction, that is, in the Z direction. The third floating via 26-2 may not contact (e.g., may be isolated from direct contact with) the first lower wiring 12*a*, the second lower wiring 12*b*, and the third lower wiring 12*a*-1 in the vertical direction, that is, in the Z direction. Restated, the third floating via 26-2 may not contact (e.g., may be isolated from direct contact with) any of the first lower wiring 12*a*, the second lower wiring 12*b*, or the third lower wiring 12*a*-1 in the vertical direction, that is, in the Z direction.

Accordingly, as previously described with reference to FIGS. 10 and 11, the contact via structure (48 in FIGS. 10 and 11) formed on the upper wiring 44 may not contact the second lower wiring 12*b* due to the third floating via 26-2.

Figure 16:
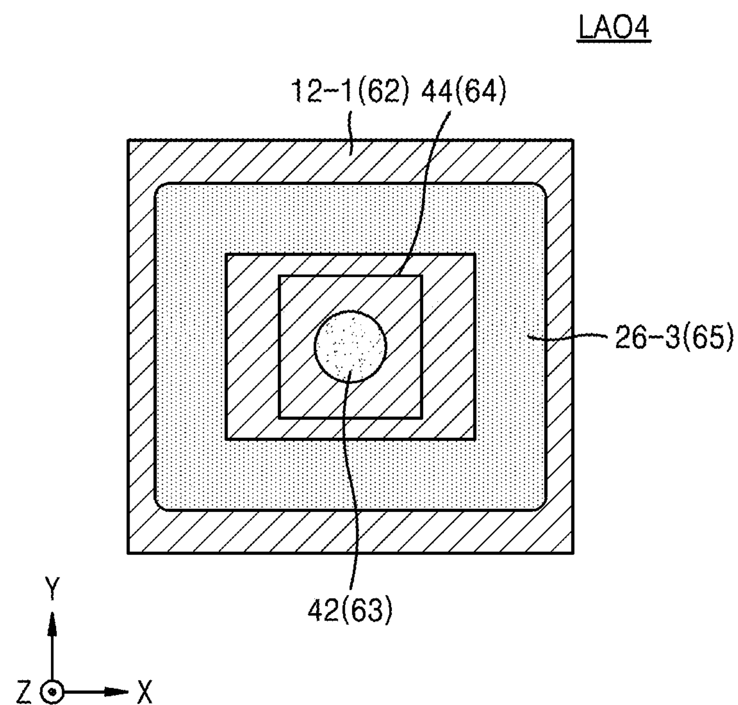
FIG. 16 is a layout diagram of a peripheral circuit structure of a 3D semiconductor device, according to some example embodiments of the inventive concepts.

FIG. 16 is a layout diagram LAO4 of a peripheral circuit structure of a 3D semiconductor device, according to some example embodiments of the inventive concepts.

In FIG. 16, the same or similar reference numerals as those in FIGS. 12 and 15 may denote the same members. The layout diagram LAO4 may, as compared with the layout diagram LAO3 of FIG. 15, may be the same as the layout diagram LAO3 except that the lower wiring 12-1 includes an island-type wiring and a fourth floating via 26-3 surrounding the island-type wiring.

In the layout diagram LAO4, the lower wiring 12-1 may include an island-type wiring extending on the substrate 50 in an island shape, and the fourth floating via 26-3 may surround the contact via 42 on the island-type lower wiring 12-1. Accordingly, as previously described with reference to FIGS. 10 and 11, the contact via structure (48 in FIGS. 10 and 11) formed on the upper wiring 44 may not contact the second lower wiring 12*b* due to the third floating via 26-2. A wiring having an island shape may have a length in a first direction (e.g., the Y direction) and a length in a second, perpendicular direction (e.g., the X direction) that is not substantially larger in magnitude than the length in the first direction (e.g., the length of an island shape wiring in the second direction may be between 0.5 times to 10 times the length in the first direction of the island shape wiring).

In some example embodiments, the first and second lower wirings 12a and 12b each include at least one of a line-type wiring arranged in a line shape on the substrate or an island-type wiring arranged in an island shape on the substrate. Additionally, the third lower wiring 12a-1 may include at least one of a line-type wiring arranged in a line shape on the substrate or an island-type wiring arranged in an island shape on the substrate.

FIGS. 17A, 17B, 17C, 17D, 17E, 17F, 17G, 17H, and 17I are cross-sectional views of main components for explaining a manufacturing method of the peripheral circuit structure 80 of a 3D semiconductor device, according to some example embodiments of the inventive concepts.

FIGS. 17A, 17B, 17C, 17D, 17E, 17F, 17G, 17H, and 17I are cross-sectional views illustrating a manufacturing method of the peripheral circuit structure 80 of the 3D semiconductor memory device (100 of FIGS. 5 through 9). In addition, FIGS. 17A, 17B, 17C, 17D, 17E, 17F, 17G, 17H, and 17I may be used not only for the manufacturing method of the peripheral circuit structure 80 in FIGS. 5 through 9 but also for a manufacturing method of a general-purpose semiconductor device.

Figure 17A:
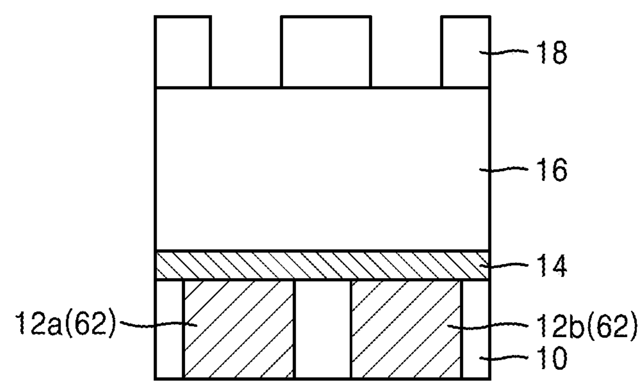
FIGS. 17A, 17B, 17C, 17D, 17E, 17F, 17G, 17H, and 17I are cross-sectional views of main components for explaining a manufacturing method of a peripheral circuit structures of a 3D semiconductor device, according to some example embodiments of the inventive concepts.

Referring to FIG. 17A, the first lower wiring 12a, the second lower wiring 12b, and the first insulating layer 10 may be formed on the substrate (not illustrated, 50 in FIGS. 6, 8, and 9). The first lower wiring 12a and the second lower wiring 12b may be apart from each other in the horizontal direction, for example, in the X direction. The first lower wiring 12a and the second lower wiring 12b may include a metallic material such as tungsten or copper. The first insulating layer 10 may insulate the first lower wiring 12a from the second lower wiring 12b. The first insulating layer 10 may include silicon oxide.

The first lower wiring 12a, the second lower wiring 12b, and the first insulating layer 10 may correspond to the first wiring level LM1 as previously described with reference to FIGS. 10 and 11. As described above, the first lower wiring 12a and the second lower wiring 12b may correspond to the lower peripheral wiring 62 in FIGS. 6, 8, and 9. The first insulating layer 10 may be included in the lower insulating layer 70 in FIGS. 6, 8, and 9.

The first stopping insulating material layer 14 may be formed on the first lower wiring 12a, the second lower wiring 12b, and the first insulating layer 10. The first stopping insulating material layer 14 may include a material having an etching selectivity with respect to the first insulating layer 10. The first stopping insulating material layer 14 may include silicon nitride. The first stopping insulating material layer 14 may function as an etch stop layer. Accordingly, the first stopping insulating material layer 14 may be referred to as a first etch stop material layer.

The via insulating material layer 16 may formed on the first stopping insulating material layer 14. The via insulating material layer 16 may include silicon oxide. The via insulating material layer 16 may be included in the lower insulating layer 70 in FIGS. 6, 8, and 9. Next, the first mask pattern 18 may be formed on the via insulating material layer 16. The first mask pattern 18 may be formed as a photoresist pattern by using a photolithography process.

Figure 17B:
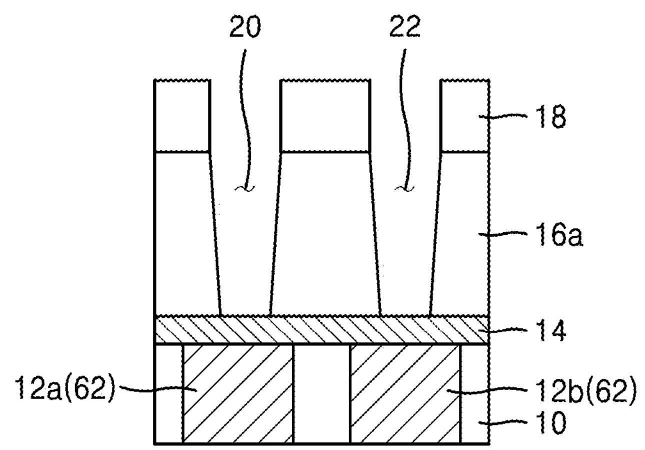
Figure 17B:
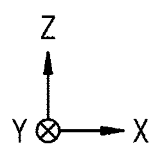

Referring to FIG. 17B, the via insulating material layer 16 may be selectively etched by using the first mask pattern 18 as an etching mask. Accordingly, a via insulating layer 16a having the floating via hole 20 and the first via hole 22 may be formed. In other words, the floating via hole 20 and the first via hole 22 may be formed in the via insulating layer 16a.

The floating via hole 20 may be formed to expose an upper surface of the first stopping insulating material layer 14 on the first lower wiring 12a. The first via hole 20 may be formed to expose the upper surface of the first stopping insulating material layer 14 on the second lower wiring 12b.

Figure 17C:
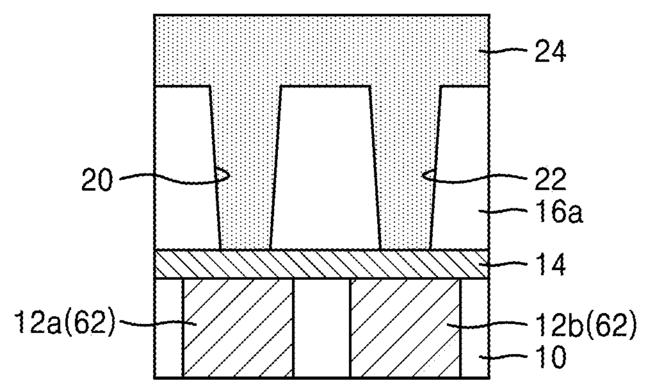
Figure 17C:
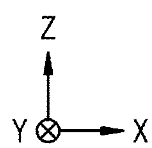

Referring to FIG. 17C, the first mask pattern 18 illustrated in FIG. 17B may be removed. Next, as illustrated in FIG. 17C, a non-conductive material layer 24 may be formed to fill the floating via hole 20 and the first via hole 22 on the entire surface of the resultant where the via insulation layer 16a has been formed. The non-conductive material layer 24 may include a polysilicon material that is not doped with impurities.

Figure 17D:
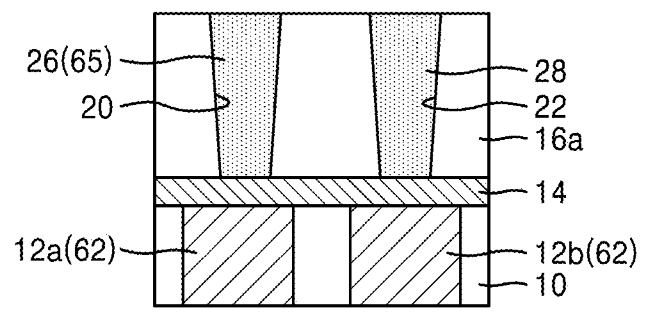
Figure 17D:
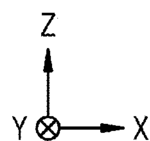

Next, as illustrated in FIG. 17D, the non-conductive material layer 24 may be etched by using an upper surface of the via insulating layer 16a as an etch stop point, and then, the floating via 26 filling the floating via hole 20 and a non-conductive via 28 filling the first via hole 22 may be formed. In other words, the floating via 26 and the non-conductive via 28 may be formed by planarizing the non-conductive material layer 24. The floating via 26 may correspond to the floating via 65 in FIGS. 6, 8, and 9.

Figure 17E:
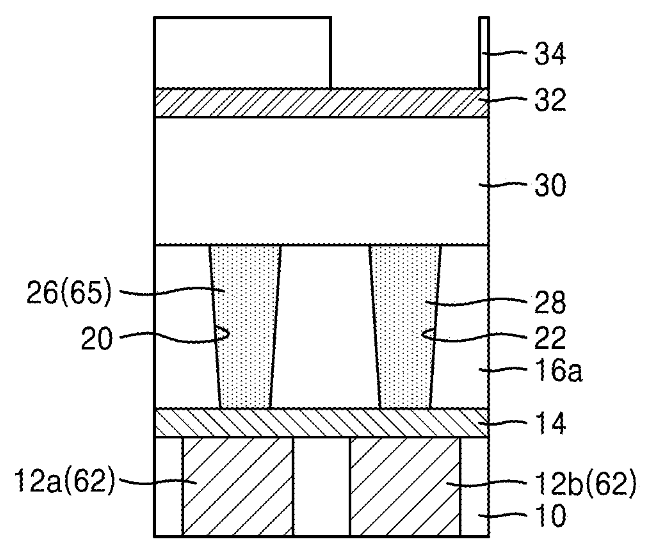
Figure 17E:
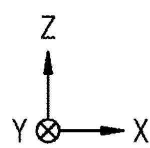

Referring to FIG. 17E, a second insulating material layer 30 may be formed on the via insulating layer 16a, the floating via 26, and the non-conductive via 28. The second insulating material layer 30 may include silicon oxide. The second insulating material layer 30 may be included in the lower insulating layer 70 in FIGS. 6, 8, and 9. A second stopping insulating material layer 32 may be formed on the second insulating material layer 30.

The second stopping insulating material layer 32 may include a material having an etching selectivity with respect to the second insulating material layer 30. The second stopping insulating material layer 32 may include silicon nitride. The second stopping insulating material layer 32 may function as an etch stop layer. Accordingly, the second stopping insulating material layer 32 may be referred to as a second etch stop material layer.

Next, a second mask pattern 34 may be formed on the second stopping insulating material layer 32. The second mask pattern 34 may be formed as a photoresist pattern by using a photolithography process.

Figure 17F:
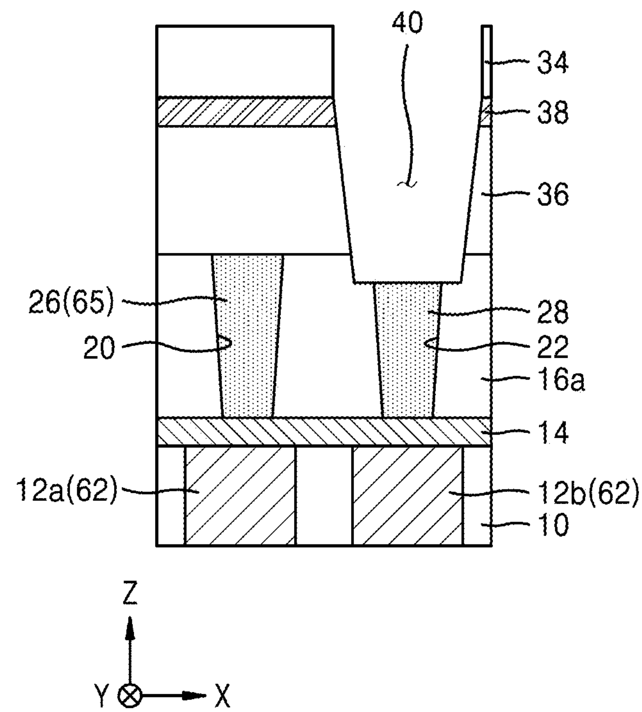
Figure 17G:
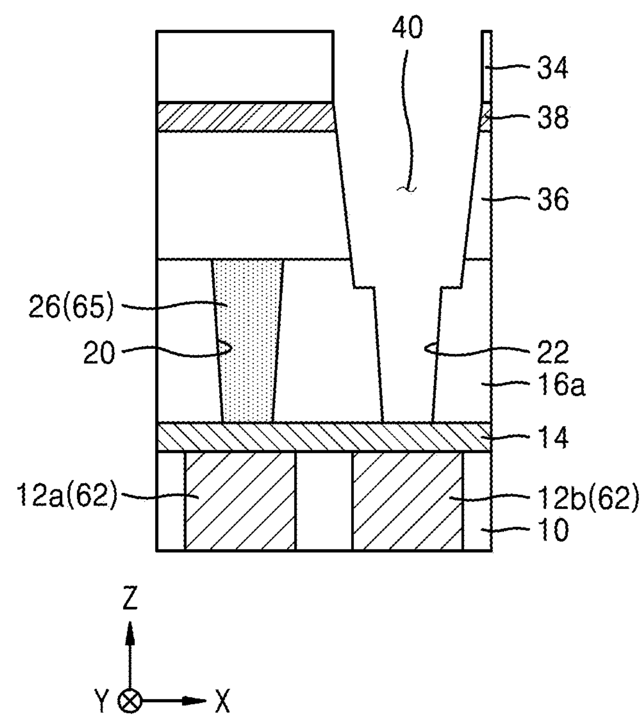

Referring to FIGS. 17F and 17G, as illustrated in FIG. 17F, the second stopping insulating material layer (32 in FIG. 17E) and the second stopping insulating material layer (32 in FIG. 17E) may be selectively etched by using the second mask pattern 34 as an etching mask. Accordingly, the second insulating layer 36 and the second stopping insulating layer 38, which include the second via hole 40, may be formed. In other words, the second via hole 40 may be formed in the second insulating layer 36 and the second stopping insulating layer 38.

The second via hole 40 may expose an upper surface of the non-conductive via 28. When the second via hole 40 is formed, the upper surface of the non-conductive via 28 may be recessed. Accordingly, the upper surface of the non-conductive via 28 may have a lower planar level than the upper surface of the floating via 26.

As illustrated in FIG. 17G, the non-conductive via 28 filling the first via hole 22 may be removed. The first via hole 22 and the second via hole 40 on the first stopping insulating material layer 14 on the second lower wiring 12b may communicate with each other. Accordingly, the upper surface of the first stopping insulating material layer 14 in the first via hole 22 may be exposed.

Figure 17H:
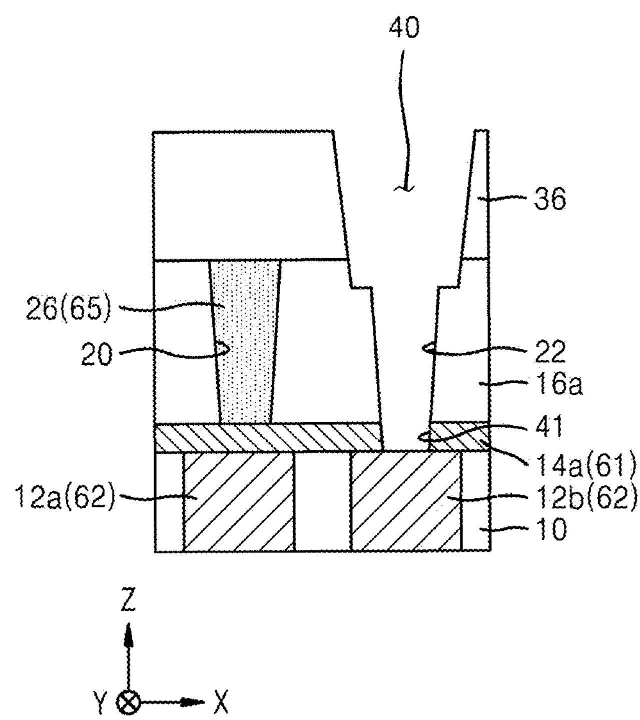
Figure 17I:
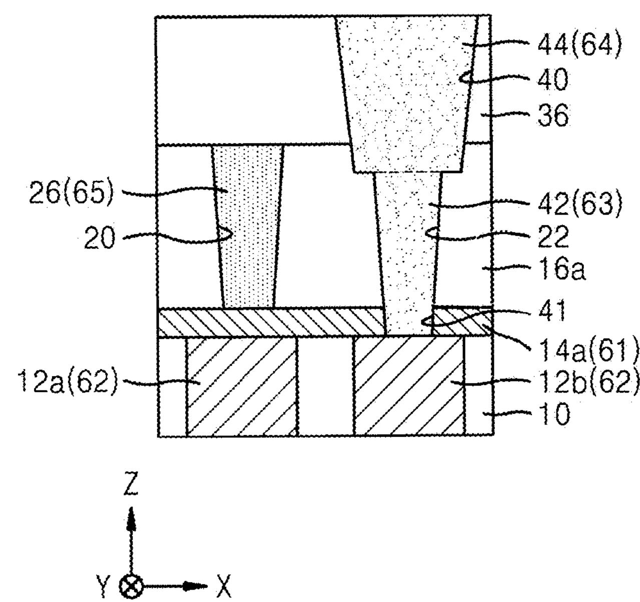

Referring to FIGS. 17H and 17I, the second mask pattern 34 in FIG. 17G may be removed. Next, as illustrated in FIG.

17H, the second stopping insulating layer 38 may be removed and at the same time, the first stopping insulating material layer 14 on the second lower wiring 12*b* may be selectively etched.

Accordingly, the first stopping insulating layer 14*a* including the third via hole 41 may be formed. In other words, the third via hole 41 exposing the second lower wiring 12*b* may be formed in the first stopping insulating layer 14*a*. The first stopping insulating layer 14*a* may correspond to the stopping insulating layer 61 in FIGS. 6, 8, and 9.

As illustrated in FIG. 17I, the contact via 42 may be formed in the third via hole 41 and the first via hole 22 on the second lower wiring 12*b*. The upper wiring 44 may be formed in the second via hole 40 on the contact via 42. The contact via 42 and the upper wiring 44 may be formed at the same time. The contact via 42 and the upper wiring 44 may be formed by forming a conductive material layer in the third via hole 41, the first via hole 22, and the second via hole 40, and then planarizing the conductive material layer.

The contact via 42 may correspond to the contact via 63 in FIGS. 6, 8, and 9. The upper wiring 44 may correspond to the upper peripheral wiring 64 in FIGS. 6, 8, and 9. The first stopping insulating layer 14*a*, the floating via 26, the contact via 42, and the via insulating layer 16*a* may correspond to the via wiring level LVIA as previously described with reference to FIGS. 10 and 11. In addition, the second insulating layer 36 and the upper wiring 44 may correspond to the second wiring level LM2 as described above with reference to FIGS. 10 and 11.

Figure 18:
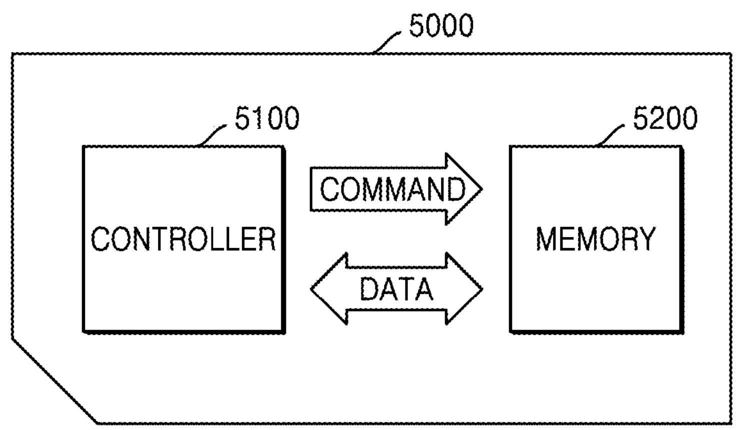
FIG. 18 is a schematic diagram of a card according to some example embodiments of the inventive concepts.

FIG. 18 is a schematic diagram of a card 5000 according to some example embodiments of the inventive concepts.

The card 5000 may include a controller 5100 (also referred to herein as a processor or processing circuitry) and a memory 5200. The controller 5100 and the memory 5200 may be arranged to exchange electrical signals with each other. For example, when the controller 5100 issues a command, the memory 5200 may transmit data. The memory 5200 may include the 3D semiconductor memory device 100 according to some example embodiments of the present inventive concepts.

The controller 5100 (also referred to herein as a processor or processing circuitry) may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The controller 5100 may be configured to generate an output based on such processing.

The card 5000 may be used in a memory device, for example, various types of cards, such as a memory stick card, a smart media (SM) card, a secure digital (SD) card, and a mini secure digital (mini SD) card, and a multi-media card (MMC).

Figure 19:
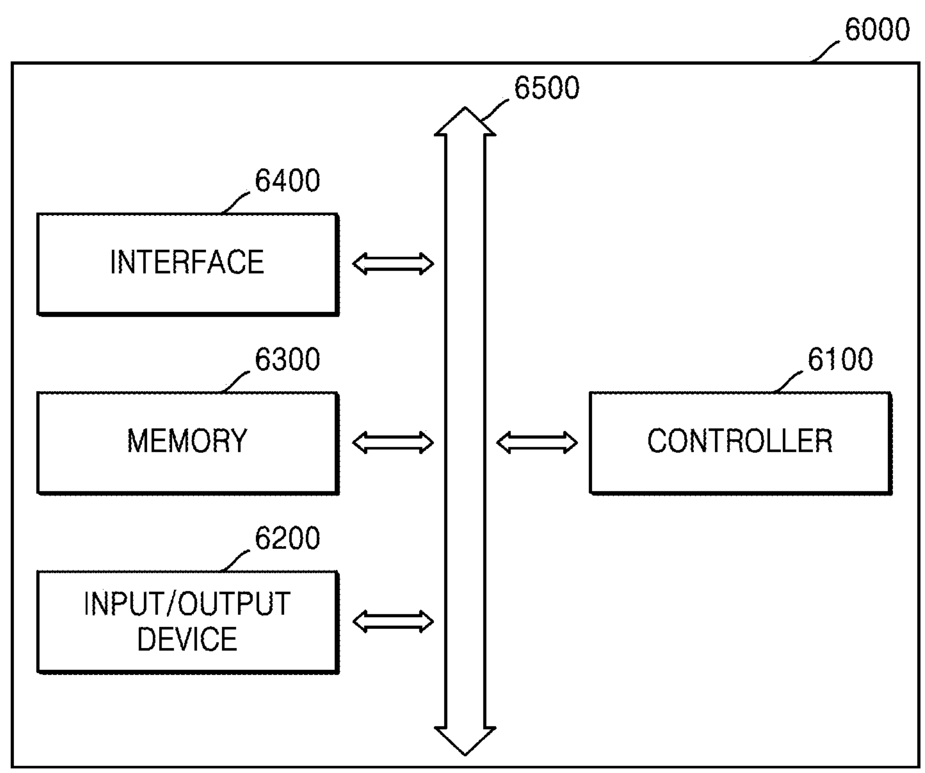
FIG. 19 is a schematic diagram of a system according to some example embodiments of the inventive concepts.

FIG. 19 is a schematic diagram of a system 6000 according to some example embodiments of the inventive concepts.

The system 6000 may include a controller 6100 (also referred to herein as a processor or processing circuitry), an input/output device 6200, a memory 6300, and an interface 6400. The system 6000 may include a mobile system or a system transceiving information. The mobile system may include a personal digital assistant (PDA), a portable computer, a web tablet, a wireless phone, a mobile phone, a digital music player, or a memory card.

The controller 6100 may execute a program (e.g., a program stored in the memory 6300) and control the system 6000. The controller 6100 may include, for example, a microprocessor, a digital signal processor, a microcontroller, or a similar device. The input/output device 6200 may be used to input or output data of the system 6000. The system 6000 may be connected to an external device, for example, a personal computer or a network, by using the input/output device 6200, and may exchange data with the external device. The input/output device 6200 may include, for example, a keypad, a keyboard, or a display.

The controller 6100 (also referred to herein as a processor or processing circuitry) may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The controller 6100 may be configured to generate an output based on such processing.

The memory 6300 may store code and/or data for the operation of the controller 6100, and/or may store data processed by the controller 6100. The memory 6300 may include the 3D semiconductor memory device 100 according to some example embodiments of the inventive concepts. The interface 6400 may be a data transmission path between the system 6000 and the external device. The controller 6100, the input/output device 6200, the memory 6300, and the interface 6400 may communicate with each other via a bus 6500.

For example, the system 6000 may be used in a mobile phone, an MP3 player, a navigation, a portable multimedia player (PMP), a solid state disk (SSD), or household appliances.

While the inventive concepts has been particularly shown and described with reference to some example embodiments thereof, it will be understood that various changes in form and details may be made therein without departing from the spirit and scope of the following claims.

What is claimed is:

1. A three-dimensional semiconductor memory device, comprising:
- a peripheral circuit structure; and
- a cell array structure on the peripheral circuit structure,
- wherein the peripheral circuit structure includes
  - a lower wiring on a substrate,
  - a stopping insulating layer on an upper surface of the lower wiring,
  - a contact via on the lower wiring and contacting the lower wiring through a via hole in the stopping insulating layer,
  - a support via on the stopping insulating layer, such that a bottom surface of the support via is on an upper surface of the stopping insulating layer, the support via not contacting the lower wiring, and
  - an upper wiring on the contact via, the upper wiring contacting the contact via.

2. The three-dimensional semiconductor memory device of claim 1, wherein the support via comprises a different material from the contact via.

3. The three-dimensional semiconductor memory device of claim 1, wherein the support via is on only one side of the contact via.

4. The three-dimensional semiconductor memory device of claim 1, further comprising:

a second support via on the stopping insulating layer, the support via and the second support via being on opposite sides of the contact via.

5. The three-dimensional semiconductor memory device of claim 1, wherein the support via surrounds the contact via.

6. The three-dimensional semiconductor memory device of claim 1, further comprising:

a contact via structure on the support via and the upper wiring, the contact via structure contacting both the support via and the upper wiring.

7. The three-dimensional semiconductor memory device of claim 1, wherein the lower wiring comprises a line-type wiring extending on the substrate in a line shape.

8. The three-dimensional semiconductor memory device of claim 1, wherein the lower wiring comprises an island-type wiring extending on the substrate in an island shape.

9. A three-dimensional semiconductor memory device, comprising:

a peripheral circuit structure; and a cell array structure on the peripheral circuit structure, wherein the peripheral circuit structure includes a first lower wiring on a substrate, a second lower wiring on the substrate, the second lower wiring isolated from direct contact with the first lower wiring in a horizontal direction, the second lower wiring adjacent to the first lower wiring in the horizontal direction, a stopping insulating layer on both the first lower wiring and the second lower wiring, the stopping insulating layer on an upper surface of the first lower wiring and an upper surface of the second lower wiring, the stopping insulating layer exposing the second lower wiring, a first support via on the stopping insulating layer, such that a bottom surface of the first support via is on an upper surface of the stopping insulating layer and at least partially overlapping the first lower wiring in a vertical direction that is perpendicular to the horizontal direction, the first support via not contacting the first lower wiring, a contact via on the second lower wiring and at least partially overlapping the second lower wiring in the vertical direction, the contact via contacting the second lower wiring through a via hole in the stopping insulating layer, and an upper wiring on the contact via, the upper wiring contacting the contact via.

10. The three-dimensional semiconductor memory device of claim 9, wherein the first support via comprises a different material from the contact via.

11. The three-dimensional semiconductor memory device of claim 9, wherein the first lower wiring is arranged horizontally on only one side of the contact via and only one side of the second lower wiring.

12. The three-dimensional semiconductor memory device of claim 9, further comprising:

a third lower wiring on the substrate, the first lower wiring and the third lower wiring on opposite sides of the contact via and the second lower wiring in the horizontal direction, and a second support via on the stopping insulating layer, the second support via at least partially overlapping the third lower wiring in the vertical direction, the second support via not contacting the third lower wiring.

13. The three-dimensional semiconductor memory device of claim 9, further comprising:

a third lower wiring on the substrate, the first lower wiring and the third lower wiring on opposite sides of the contact via and the second lower wiring in the horizontal direction, and a third support via surrounding the contact via in a horizontal plane that includes the horizontal direction, the third support connected to the first support via, the third support via not contacting any of the first lower wiring, the second lower wiring, or the third lower wiring.

14. The three-dimensional semiconductor memory device of claim 9, further comprising:

a contact via structure on the first support via and contacting the first support via.

15. The three-dimensional semiconductor memory device of claim 9, further comprising:

a contact via structure on the first support via and the upper wiring, the contact via structure contacting both the first support via and the upper wiring.

16. A three-dimensional semiconductor memory device, comprising:

a peripheral circuit structure; and a cell array structure on the peripheral circuit structure, wherein the peripheral circuit structure includes a first wiring level including a first lower wiring and a second lower wiring that are each on a substrate, the second lower wiring isolated from direct contact with, and adjacent to, the first lower wiring in a horizontal direction, a first insulating layer in the first wiring level, the first insulating layer insulating the first lower wiring from the second lower wiring, a stopping insulating layer on an upper surface of the first lower wiring, an upper surface of the second lower wiring, and an upper surface of the first insulating layer, the stopping insulating layer exposing the second lower wiring, a first support via on the stopping insulating layer, such that a bottom surface of the first support via is on an upper surface of the stopping insulating layer and at least partially overlapping the first lower wiring in a vertical direction that is perpendicular to the horizontal direction, the first support via not contacting the first lower wiring, a contact via on the second lower wiring and at least partially overlapping the second lower wiring in the vertical direction, the contact via contacting the second lower wiring through a via hole in the stopping insulating layer, a via insulating layer insulating the contact via from the first support via, a second wiring level on the contact via, the second wiring level including an upper wiring contacting the contact via, and a second insulating layer surrounding the upper wiring in the second wiring level, wherein the first support via includes a different material form the contact via.

17. The three-dimensional semiconductor memory device of claim 16, wherein the first support via comprises a polysilicon layer that includes no impurities doped thereon, and the contact via comprises a conductive material.

18. The three-dimensional semiconductor memory device of claim 16, further comprising a third lower wiring on the substrate, the first lower wiring and the third lower wiring on opposite sides of the contact via and the second lower wiring in the horizontal direction, and a second support via on the stopping insulating layer, the second support via at least partially overlapping the third lower wiring in the vertical direction, the second support via not contacting the third lower wiring.

19. The three-dimensional semiconductor memory device of claim 16, further comprising:

a contact via structure on the first support via and the second wiring level, the contact via structure contacting both the first support via and the upper wiring.

20. The three-dimensional semiconductor memory device of claim 16, wherein the first lower wiring and the second lower wiring each comprise at least one of a line-type wiring arranged in a line shape on the substrate, or an island-type wiring arranged in an island shape on the substrate.

* * * * *